(12) United States Patent
Kang et al.

(10) Patent No.: US 12,453,091 B2
(45) Date of Patent: Oct. 21, 2025

(54) METHOD OF FABRICATING INTEGRATED CIRCUIT DEVICE AND METHOD OF FABRICATING ELECTRONIC SYSTEM HAVING THE SAME

(71) Applicant: SAMSUNG ELECTRONICS CO., LTD., Suwon-si (KR)

(72) Inventors: Sangmin Kang, Hwaseong-si (KR); Hyungjoon Kim, Yongin-si (KR); Woojin Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 749 days.

(21) Appl. No.: 17/736,173

(22) Filed: May 4, 2022

(65) Prior Publication Data

US 2023/0087072 A1 Mar. 23, 2023

(30) Foreign Application Priority Data

Sep. 17, 2021 (KR) .................. 10-2021-0125208

(51) Int. Cl.
| | |
|---|---|
| H10B 43/27 | (2023.01) |
| H10B 41/10 | (2023.01) |
| H10B 41/27 | (2023.01) |
| H10B 41/35 | (2023.01) |
| H10B 41/40 | (2023.01) |
| H10B 43/10 | (2023.01) |
| H10B 43/35 | (2023.01) |
| H10B 43/40 | (2023.01) |

(52) U.S. Cl.
CPC ............ *H10B 43/27* (2023.02); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02)

(58) Field of Classification Search
None
See application file for complete search history.

(56) References Cited

U.S. PATENT DOCUMENTS

| 7,884,417 B2 | 2/2011 | Mizukami et al. |
| 8,921,182 B2 | 12/2014 | Jung et al. |
| 10,367,003 B2 | 7/2019 | Kang et al. |

(Continued)

FOREIGN PATENT DOCUMENTS

| CN | 109671716 A | 4/2019 |
| KR | 10-0983451 | 9/2010 |

(Continued)

*Primary Examiner* — Michelle Mandala
(74) *Attorney, Agent, or Firm* — Morgan, Lewis & Bockius LLP

(57) ABSTRACT

A method of fabricating an integrated circuit device includes forming on a semiconductor substrate a mold stack that includes a plurality of insulating layers and a plurality of mold layers alternately arranged. A mask pattern including an opening is formed on the mold stack. A channel hole is formed by removing the mold stack exposed through the opening. A sacrificial film is formed on a lateral wall of the mold stack exposed through the channel hole. An oxidation process is performed on the sacrificial film and the mold stack to convert the sacrificial film to a sacrificial oxide film. An etching process is performed to remove the sacrificial oxide film.

19 Claims, 23 Drawing Sheets

(56) References Cited

U.S. PATENT DOCUMENTS

| | | |
|---|---|---|
| 10,553,686 B2 | 2/2020 | Ko et al. |
| 10,790,297 B2 * | 9/2020 | Chen ................. H01L 21/02057 |
| 10,964,530 B2 | 3/2021 | Ko et al. |
| 11,217,602 B2 | 1/2022 | Bin et al. |
| 2014/0367762 A1 | 12/2014 | Tian et al. |
| 2017/0200611 A1 | 7/2017 | Park et al. |
| 2021/0091102 A1 | 3/2021 | Zhu et al. |
| 2022/0157848 A1 * | 5/2022 | Lue ....................... H10B 43/27 |

FOREIGN PATENT DOCUMENTS

| | | |
|---|---|---|
| KR | 10-2013-0127791 | 11/2013 |
| KR | 10-2017-0082893 | 7/2017 |
| KR | 10-2017-0142774 | 12/2017 |
| KR | 10-2019-0030169 | 3/2019 |
| KR | 10-2019-0049501 | 5/2019 |
| KR | 10-2020-0141257 A | 12/2020 |
| KR | 10-2021-0021046 | 2/2021 |

\* cited by examiner

METHOD OF FABRICATING INTEGRATED CIRCUIT DEVICE AND METHOD OF FABRICATING ELECTRONIC SYSTEM HAVING THE SAME

CROSS-REFERENCE TO RELATED APPLICATION

This application claims priority under 35 U.S.C. § 119 to Korean Patent Application No. 10-2021-0125208, filed on Sep. 17, 2021 in the Korean Intellectual Property Office, the disclosure of which is incorporated by reference in its entirety herein.

1. TECHNICAL FIELD

The present inventive concept relates to a method of fabricating an integrated circuit device and a method of fabricating an electronic system having the integrated circuit device, and more particularly, to a method of fabricating an integrated circuit device having a non-volatile vertical memory device and a method of fabricating an electronic system including the integrated circuit device.

2. DISCUSSION OF RELATED ART

The degree of integration in integrated circuit devices has increased to provide increased performance and economic efficiency. In particular, a high degree of integration of a memory device provides an increased economic efficiency for an electronic product that the memory device is applied thereto. The degree of integration of a two-dimensional (2D) memory device is determined mainly by an area occupied by a unit memory cell, and accordingly, is affected greatly by the level of micro-pattern formation technologies. However, expensive equipment is required to form micro-patterns and an area of a chip die is limited. Therefore, while the degree of integration of 2D memory devices has increased, the degree of integration of 2D memory devices is still limited. Hence, there has been an increased demand for a vertical memory device having a three-dimensional (3D) structure.

SUMMARY

The present inventive concept provides an increase in structural reliability and electronic reliability of a channel structure by forming a channel hole having a substantially vertical lateral wall on a semiconductor substrate.

The object which the technical ideas of the present inventive concept seek to achieve is not limited to the foregoing, and other objects may be clearly understood by a person skilled in the art from the description below.

According to an embodiment of the present inventive concept, a method of fabricating an integrated circuit device includes forming on a semiconductor substrate a mold stack that includes a plurality of insulating layers and a plurality of mold layers alternately arranged. A mask pattern including an opening is formed on the mold stack. A channel hole is formed by removing the mold stack exposed through the opening. A sacrificial film is formed on a lateral wall of the mold stack exposed through the channel hole. An oxidation process is performed on the sacrificial film and the mold stack to convert the sacrificial film to a sacrificial oxide film. An etching process is performed to remove the sacrificial oxide film.

According to an embodiment of the present inventive concept, a method of fabricating an integrated circuit device includes forming on a semiconductor substrate a first mold stack that includes a plurality of insulating layers and a plurality of mold layers alternately arranged. A first mask pattern including a first opening is formed on the first mold stack. A first channel hole is formed by removing the first mold stack exposed through the first opening. A second mold stack is formed on the first mold stack. The second mold stack includes a plurality of insulating layers and a plurality of mold layers alternately arranged. A second mask pattern including a second opening is formed on the second mold stack. A second channel hole is formed by removing the second mold stack exposed through the second opening. A sacrificial film is formed on a lateral wall of the first and second mold stacks exposed through the first channel hole and the second channel hole, respectively. An oxidation process is performed on the sacrificial film, the first mold stack and the second mold stack to convert the sacrificial film to a sacrificial oxide film. An etching process is performed to remove the sacrificial oxide film.

According to an embodiment of the present inventive concept, a method of fabricating an electronic system includes preparing a main substrate. An integrated circuit device is arranged on the main substrate. A controller electrically connected to the integrated circuit device is arranged on the main substrate. A method of fabricating the integrated circuit device includes forming on a semiconductor substrate a mold stack that includes a plurality of insulating layers and a plurality of mold layers alternately arranged. A mask pattern including an opening is formed on the mold stack. A channel hole is formed by removing the mold stack exposed through the opening. A sacrificial film is formed on a lateral wall of the mold stack exposed through the channel hole. An oxidation process is performed on the sacrificial film and the mold stack to convert the sacrificial film to a sacrificial oxide film. An etching process is performed to remove the sacrificial oxide film. The plurality of mold layers is substituted with a plurality gate electrodes.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Hereinafter, embodiments of the present inventive concept are described in detail with reference to the accompanying drawings.

Figure 1:
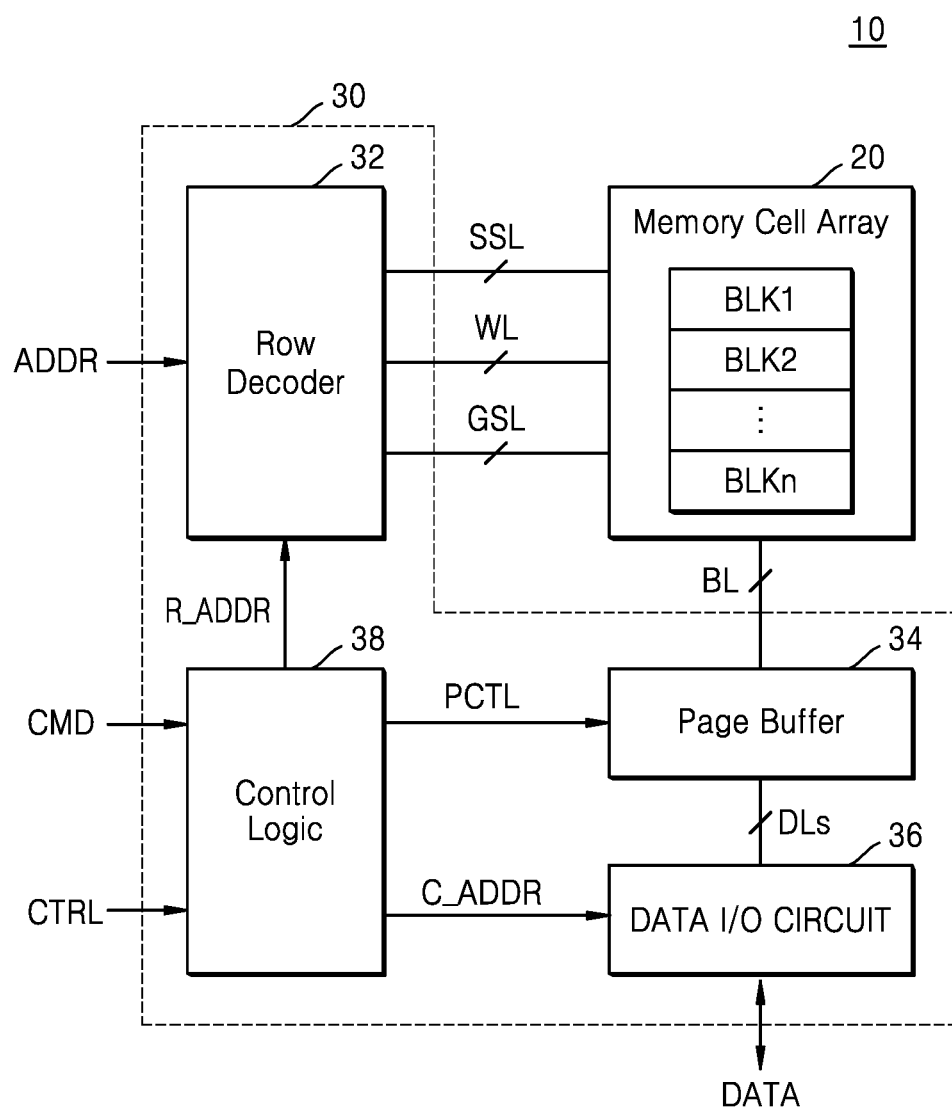
FIG. 1 is a block diagram illustrating an integrated circuit device according to an embodiment of the present inventive concept.

FIG. 1 is a block diagram illustrating an integrated circuit device according to an embodiment.

With reference to FIG. 1, an integrated circuit device 10 may include a memory cell array 20 and a peripheral circuit 30.

The memory cell array 20 may include a plurality of memory cell blocks BLK1, BLK2, . . . , BLKn. N may be a whole number greater than or equal to 3. Each of the plurality of memory cell blocks BLK1, BLK2, . . . , BLKn may include a plurality of memory cells. The plurality of memory cell blocks BLK1, BLK2, . . . , BLKn may be connected to the peripheral circuit 30 through a bit line BL, a word line WL, a string select line SSL, and a ground select line GSL.

The memory cell array 20 may be connected to a page buffer 34 through the bit line BL, and to a row decoder 32 through the word line WL, the string select line SSL, and the ground select line GSL. In the memory cell array 20, each of the plurality of memory cells included in the plurality of memory cell blocks BLK1, BLK2, . . . , BLKn may be a flash memory cell. The memory cell array 20 may include a three dimensional (3D) memory cell array. The 3D memory cell array may include a plurality of NAND strings, and each of the plurality of NAND strings may include a plurality of memory cells connected to a plurality of vertically stacked word lines WL.

The peripheral circuit 30 may include the row decoder 32, the page buffer 34, a data input/output circuit 36, and a control logic 38. In an embodiment, the peripheral circuit 30 may further include various circuits, such as a voltage generation circuit to generate various voltages required for operations of the integrated circuit device 10, an error correction circuit to correct errors in data read from the memory cell array 20, an input/output interface, etc.

In an embodiment as shown in FIG. 1, the peripheral circuit 30 may receive an address ADDR, a command CMD, and a control signal CTRL from the outside of the integrated circuit device 10, and receive and transmit data DATA with a device outside of the integrated circuit device 10.

The configuration of the peripheral circuit 30 is further described in detail as below.

The row decoder 32 may select at least one of the plurality of memory cell blocks BLK1, BLK2, . . . , BLKn in response to an address ADDR from the outside, and may select a word line WL, a string select line SSL, and a ground select line GSL of a selected memory cell block. The row decoder 32 may transmit a voltage for memory operations to the word line WL of the selected memory cell block.

The page buffer 34 may be connected to the memory cell array 20 through a bit line BL. The page buffer 34 may operate as a writing driver during a program operation and apply to the bit line BL a voltage according to data DATA to be stored in the memory cell array 20, and during a read operation, the page buffer 34 may operate as a sense amplifier and apply data DATA stored in the memory cell array 20. The page buffer 34 may operate according to a control signal PCTL provided from the control logic 38.

The data input/output circuit 36 may be connected to the page buffer 34 through data lines DLs. During the program operation, the data input/output circuit 36 may receive data DATA from a memory controller and provide program data DATA to the page buffer 34 based on a column address C_ADDR provided from the control logic 38. During the read operation, the data input/output circuit 36 may provide read data DATA stored in the page buffer 34 to the memory controller based on the column address C_ADDR provided from the control logic 38. The data input/output circuit 36 may transmit input addresses or commands to the control logic 38 or the row decoder 32.

The control logic 38 may receive the command CMD and the control signal CTRL from the memory controller. The control logic 38 may provide a row address R_ADDR to the row decoder 32, and provide the column address C_ADDR to the data input/output circuit 36. The control logic 38 may generate various internal control signals used in the integrated circuit device 10 in response to the control signal CTRL. For example, the control logic 38 may adjust a level of a voltage provided to the word line WL and the bit line BL when performing memory operations, such as a program operation or an erase operation, etc.

Figure 2:
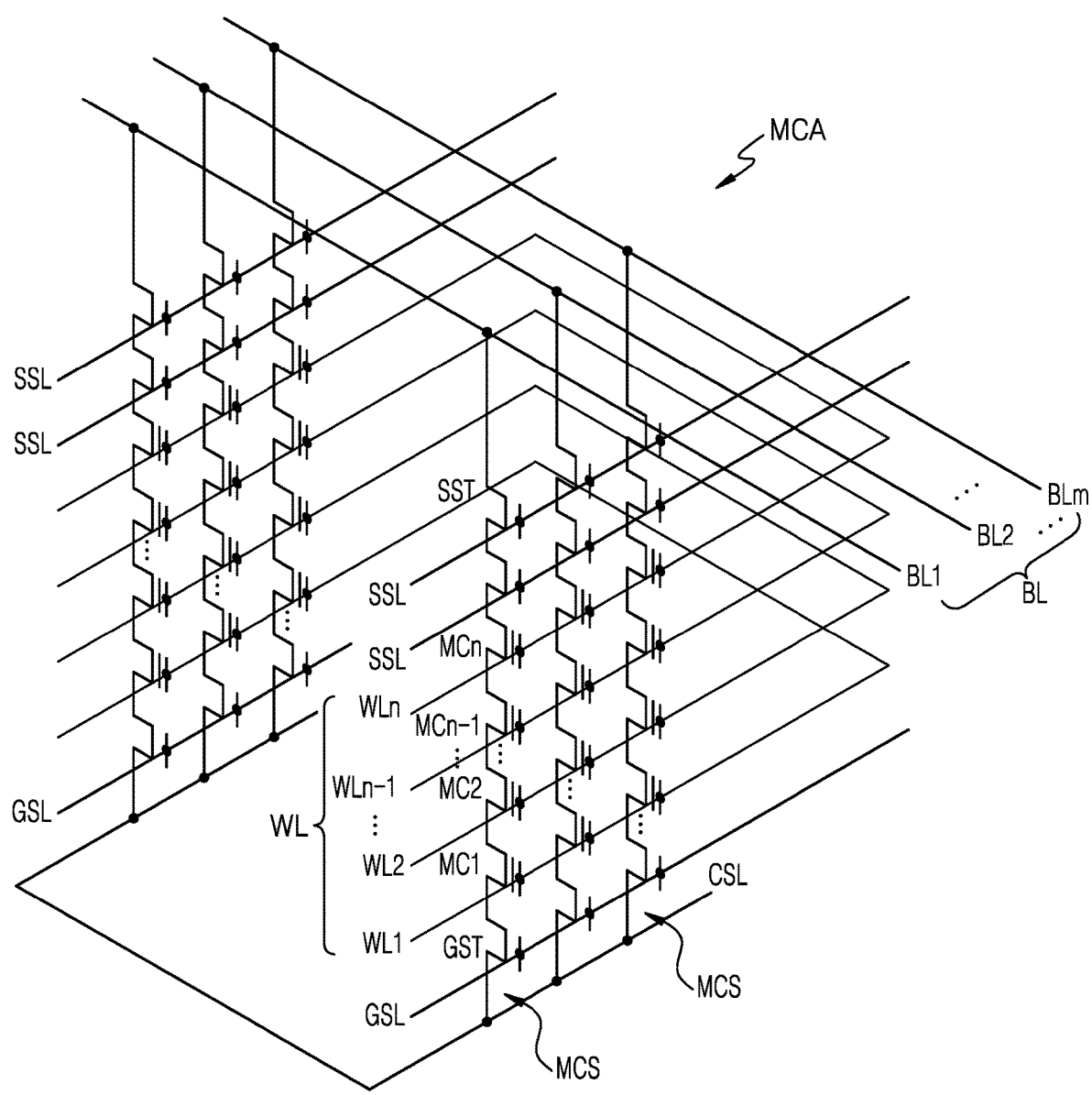
FIG. 2 is an equivalent circuit diagram of a memory cell array of an integrated circuit device according to an embodiment of the present inventive concept.

FIG. 2 is an equivalent circuit diagram of a memory cell array of an integrated circuit device according to an embodiment.

With reference to FIG. 2, an example of an equivalent circuit diagram of a vertical NAND flash memory device having a vertical channel structure is provided.

A memory cell array MCA may include a plurality of memory cell strings MCS. The memory cell array MCA may include a plurality of bit lines BL, a plurality of word lines WL, at least one string select line SSL, at least one ground select line GSL, and a common source line CSL.

A plurality of memory cell strings MCS may be formed between the plurality of bit lines BL and the common source line CSL. FIG. 2 illustrates the plurality of memory cell strings MCS as respectively including two string select lines SSL. However, embodiments of the present inventive concept are not necessarily limited thereto. For example, the plurality of memory cell strings MCS may each include one string select line SSL, etc.

The plurality of memory cell strings MCS may each include a string select transistor SST, a ground select transistor GST, and a plurality of memory cell transistors MC1, MC2, . . . , MCn−1, MCn. In an embodiment, a drain region of the string select transistor SST may be connected to the bit line BL, and a source region of the ground select transistor GST may be connected to the common source line CSL. The common source line CSL may be a region commonly connected to the source region of a plurality of ground select transistors GST.

The string select transistor SST may be connected to the string select line SSL, and the ground select transistor GST may be connected to the ground select line GSL. The plurality of memory cell transistors MC1, MC2, . . . , MCn−1, MCn may be respectively connected to the plurality of word lines WL.

Figure 3:
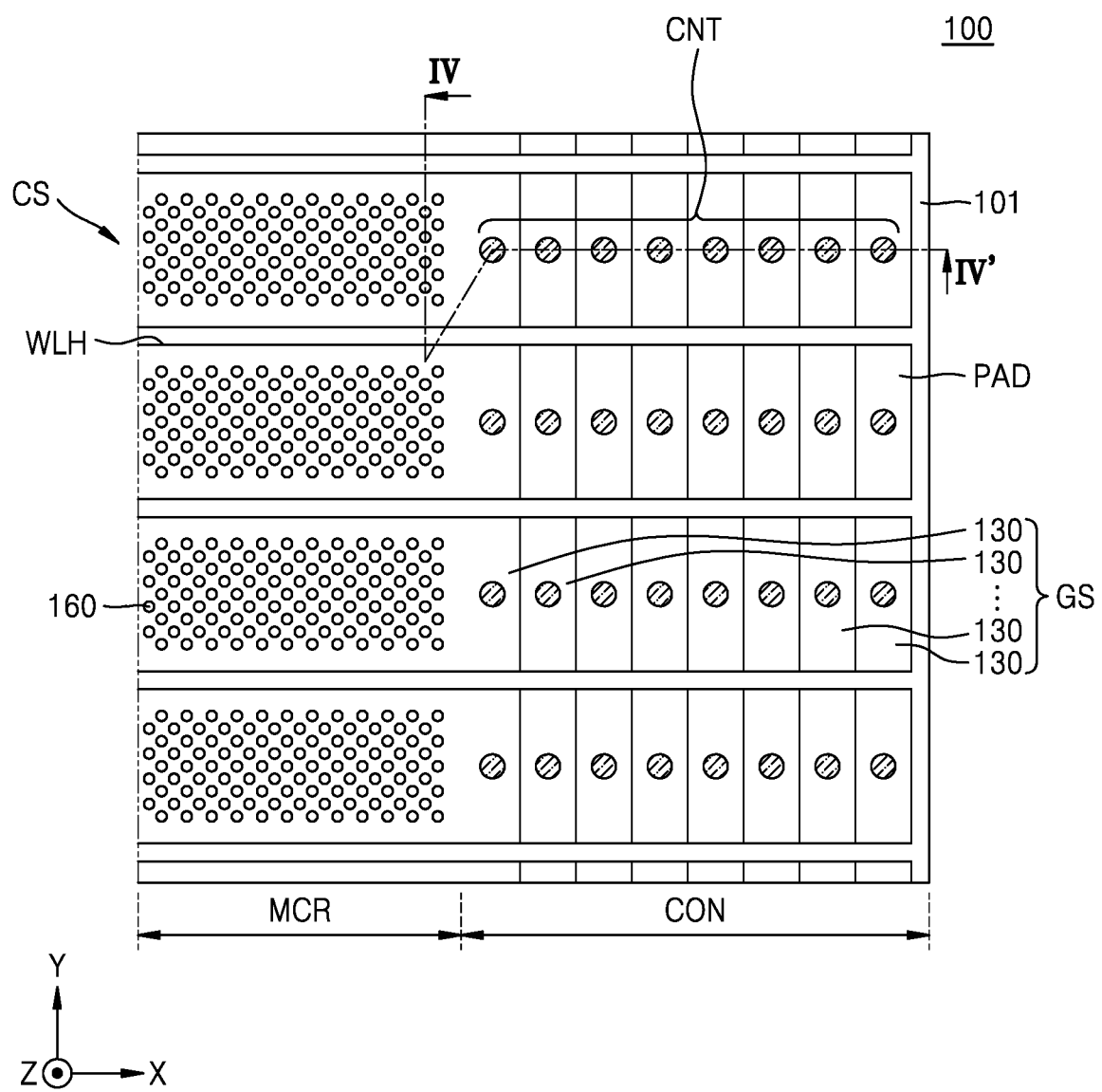
FIG. 3 is a plan view showing components of an integrated circuit device fabricated by a method of fabricating an integrated circuit device, according to an embodiment of the present inventive concept.
Figure 4:
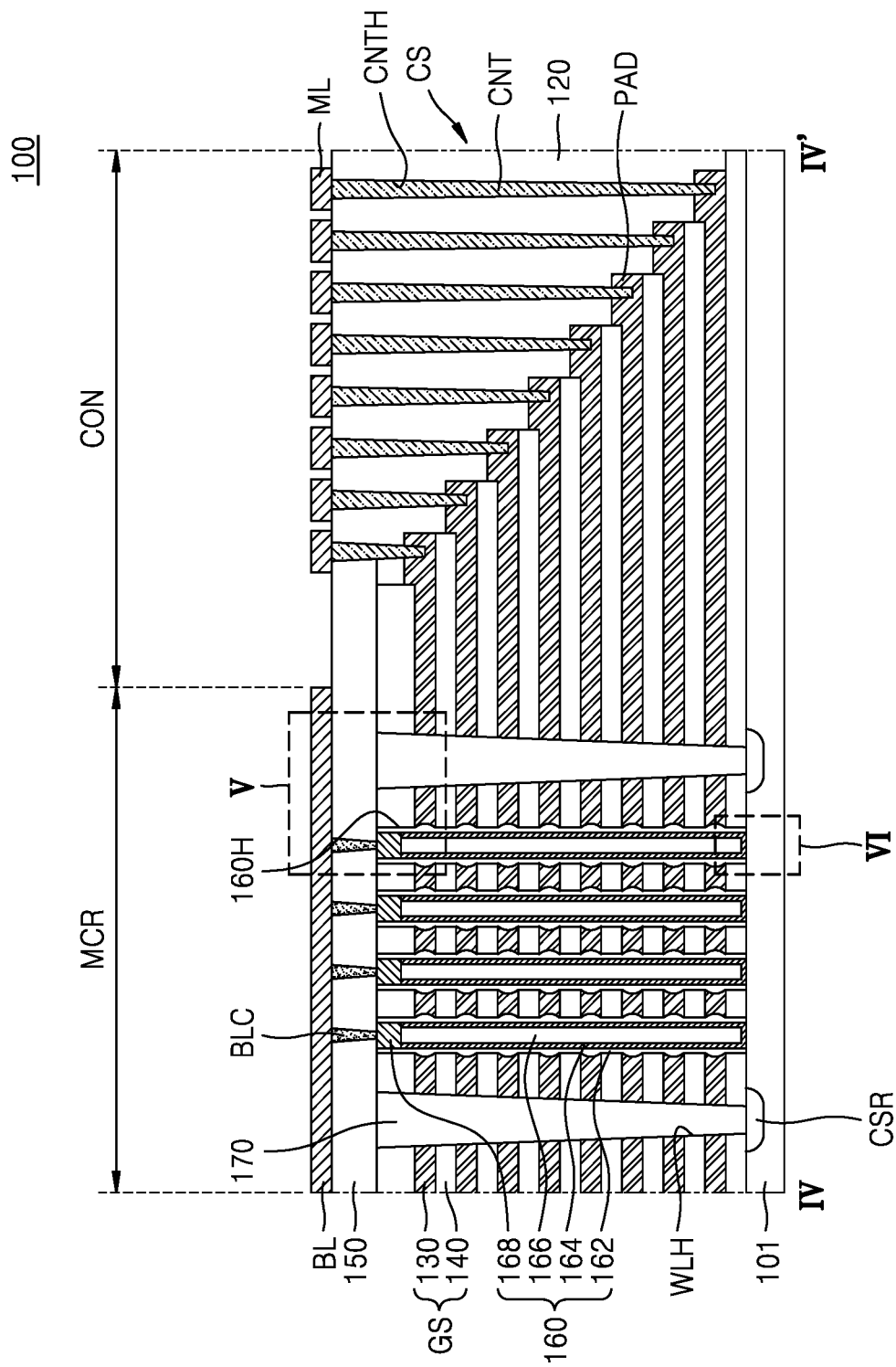
FIG. 4 is a cross-sectional view of components of an integrated circuit device fabricated by a method of fabricating an integrated circuit device taken along line IV-IV' of FIG. 3 according to an embodiment of the present inventive concept.
Figure 5:
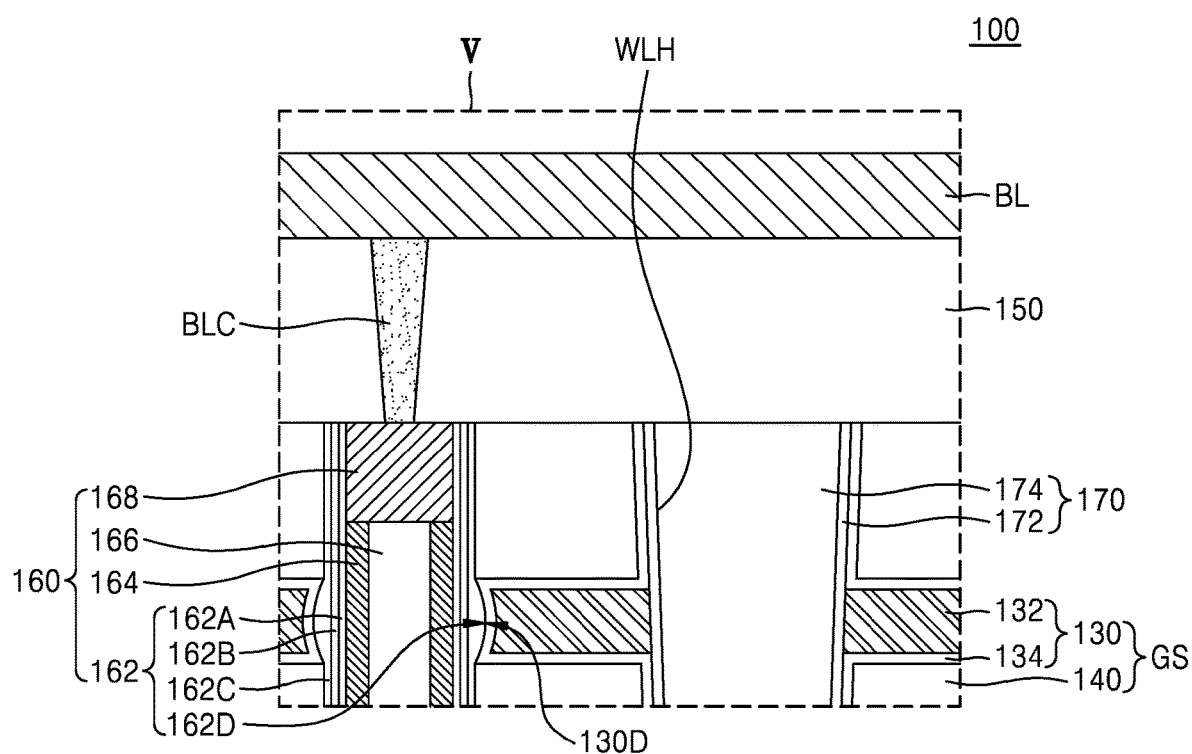
FIG. 5 is an enlarged view of components of an integrated circuit device fabricated by a method of fabricating an integrated circuit device taken from region V of FIG. 4 according to an embodiment of the present inventive concept.
Figure 6:
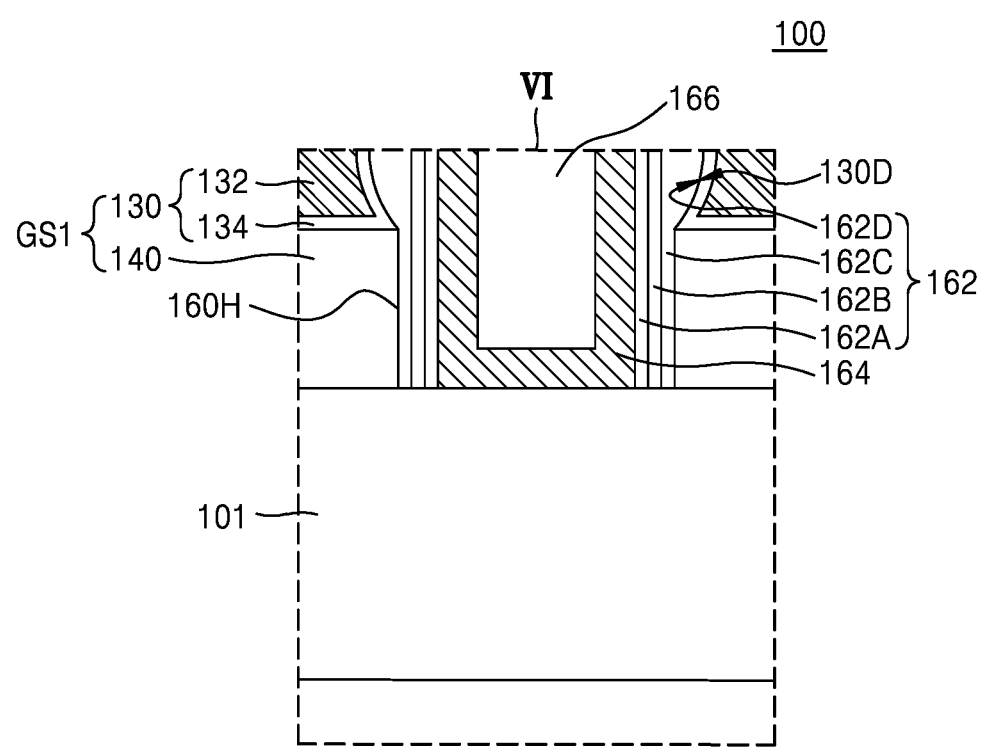
FIG. 6 is an enlarged view of components of an integrated circuit device fabricated by a method of fabricating an integrated circuit device taken from region VI of FIG. 4 according to an embodiment of the present inventive concept.

FIG. 3 is a plan view showing components of an integrated circuit device fabricated by a method of fabricating an integrated circuit device, according to an embodiment. FIG. 4 is a cross-sectional view taken along line IV-IV' of FIG. 3. FIG. 5 is an enlarged view of V region of FIG. 4. FIG. 6 is an enlarged view of VI region of FIG. 4.

With reference to FIGS. 3 to 6, an integrated circuit device 100 may include a cell array structure CS including a memory cell region MCR and a connection region CON.

The memory cell region MCR may be a region in which the vertical channel structure NAND-type memory cell array MCA described above with reference to FIG. 2 is formed. The connection region CON may be a region in which a pad portion PAD to electrically connect the memory cell array MCA formed in the memory cell region MCR to a peripheral circuit region is formed.

In an embodiment, a semiconductor substrate 101 may include a semiconductor material, for example, Group IV semiconductors, Group III-V compound semiconductors, or Group II-VI oxide semiconductors. For example, the Group IV semiconductors may include silicon (Si), germanium (Ge), or silicon-germanium. The semiconductor substrate 101 may be provided as a bulk wafer or a wafer on which an epitaxial layer is formed. However, embodiments of the present inventive concept are not necessarily limited thereto. For example, in some embodiments, the semiconductor substrate 101 may include a silicon-on-insulator (SOI) substrate or a germanium-on-insulator (GeOI) substrate.

A gate stack GS may extend on the semiconductor substrate 101 in a first direction (X direction) and a second direction (Y direction) parallel to an upper surface of the semiconductor substrate 101. The gate stack GS may include a plurality of gate electrodes 130 and a plurality of insulating layers 140, and the plurality of gate electrodes 130 and the plurality of insulating layers 140 may be arranged alternately in a third direction (Z direction) perpendicular to an upper surface of the semiconductor substrate 101. Further, an upper insulating layer 150 may be arranged at the top of the gate stack GS.

The gate electrode 130 may include a buried conductive layer 132 (FIG. 5) and an insulating liner 134 surrounding an upper surface, a bottom surface, and a lateral surface of the buried conductive layer 132. For example, in an embodiment, the buried conductive layer 132 may include a metal such as tungsten, metal silicide such as tungsten silicide, doped polysilicon, or a combination thereof. In some embodiments, the insulating liner 134 may include a high-k material such as an aluminum oxide.

The plurality of gate electrodes 130 may correspond to the ground select line GSL, the word line WL, and at least one string select line SSL constituting the memory cell string MCS described above with reference to an embodiment shown in FIG. 2. For example, the lowermost gate electrode 130 may function as the ground select line GSL, the uppermost gate electrode 130 may function as the string select line SSL, and the remaining gate electrodes 130 may function as the word line WL. Accordingly, the memory cell string MCS of which the ground select transistor GST, the string select transistor SST, and the memory cell transistors MC1, MC2, . . . , MCn−1, MCn therebetween are connected in series may be provided.

According to a method of fabricating the integrated circuit device 100 of the present inventive concept, each of the plurality of gate electrodes 130 may include a round recess 130D at an end adjacent to a channel structure 160. An area occupied by the round recess 130D at an upper portion of the gate stack GS may be less than an area occupied by the round recess 130D at a lower portion of the gate stack GS. For example, an end of the gate electrode 130 positioned at the lower portion of the gate stack GS may be relatively more recessed.

On the semiconductor substrate 101, a plurality of word line cuts 170 may extend in a first direction (X direction) in a word line cut opening WLH. The gate stack GS arranged between a pair of word line cuts 170 may constitute a block, and the pair of word line cuts 170 may define a width of the gate stack GS in a second direction (Y direction). The word line cut 170 may include an insulating spacer 172 and an insulating separation layer 174. For example, the word line cut 170 may have an insulating structure. A plurality of common source regions CSR may be formed at the semiconductor substrate 101. The plurality of common source regions CSR may be impurity regions doped with high concentration impurities. The word line cut 170 may have a tapered shape in which a horizontal width of the word line cut 170 tapers off from the upper portion towards the lower portion thereof in the third direction (Z direction).

In the memory cell region MCR, the plurality of channel structures 160 may extend from the upper surface of the semiconductor substrate 101, penetrating the gate electrode 130 in the third direction (Z direction). In an embodiment, the plurality of channel structures 160 may be spaced apart from each other at a certain interval in the first direction (X direction) and the second direction (Y direction). For example, the plurality of channel structures 160 may be arranged in zigzags or in a staggered manner. However, embodiments of the present inventive concept are not necessarily limited thereto.

The plurality of channel structures 160 may be formed to extend in a channel hole 160H penetrating the gate stack GS. The plurality of channel structures 160 may each include a gate insulating layer 162, a channel layer 164, a buried insulating layer 166, and a conductive plug 168. The gate insulating layer 162 and the channel layer 164 may be sequentially arranged on a lateral wall of the channel hole 160H. For example, the gate insulating layer 162 may be conformally arranged on the lateral wall of the channel hole 160H, and the channel layer 164 may be conformally arranged on the lateral wall and a bottom of the channel hole 160H. The buried insulating layer 166 is arranged to fill a remaining space of the channel hole 160H on the channel layer 164. The conductive plug 168, which is in direct contact with the channel layer 164 and blocks an entrance (e.g., the uppermost portion) of the channel hole 160H, may be arranged on the channel hole 160H. However, embodiments of the present inventive concept are not necessarily limited thereto. For example, in some embodiments, the buried insulating layer 166 may be omitted, and the channel layer 164 may be formed in a pillar shape to fill the remaining space of the channel layer 164. The areas occupied by the channel layer 164 and the buried insulating layer 166 may have a rectangular shape in which a horizontal width of the areas is substantially constant along the third direction (Z direction) from the upper portion to the lower portion.

The plurality of channel structures 160 may be in direct contact with the semiconductor substrate 101. In some embodiments, the channel layer 164 may be arranged to be in direct contact with the upper surface of the semiconductor substrate 101 at the bottom of the channel hole 160H. In some embodiments, a contact semiconductor layer having a certain height may be formed on the semiconductor substrate 101 at the bottom of the channel hole 160H, and the channel layer 164 may be electrically connected to the semiconductor substrate 101 through the contact semiconductor layer.

The gate insulating layer 162 may have a structure including a tunneling dielectric film 162A, a charge storage film 162B, and a blocking dielectric film 162C disposed on an outer wall of the channel layer 164 in this stated order. Relative thicknesses of the tunneling dielectric film 162A, the charge storage film 162B, and the blocking dielectric film 162C constituting the gate insulating layer 162 are not limited to the descriptions of the drawings, and may vary.

In an embodiment, the tunneling dielectric film 162A may include a silicon oxide, a hafnium oxide, an aluminum oxide, a zirconium oxide, a tantalum oxide, etc. The charge storage film 162B may be a region in which electrons which have passed through the tunneling dielectric film 162A from the channel layer 164 may be stored, and may include a silicon oxide, a boron nitride, a silicon boron nitride, or polysilicon doped with impurities. The blocking dielectric film 162C may include a silicon oxide, a silicon nitride, or a metal oxide having a permittivity greater than that of a silicon oxide.

According to a method of fabricating the integrated circuit device 100 of the present inventive concept, each of the plurality of channel structures 160 may include a round protrusion 162D on a lateral wall adjacent to the gate electrode 130. The round protrusion 162D may be a part of the blocking dielectric film 162C. An area occupied by the round protrusion 162D at the upper portion of the gate stack GS may be less than an area occupied by the round protrusion 162D at the lower portion of the gate stack GS. For example, a lateral wall of the channel structure 160 positioned at the lower portion of the gate stack GS may be relatively more protruded.

In the connection region CON, the gate electrode 130 may extend to form the pad portion PAD at the end of the gate electrode 130, and a cover insulating layer 120 may be arranged to cover the pad portion PAD. Further, the end of the gate electrode 130 may have a greater thickness (e.g., length in the third direction or Z direction) than other portions of the gate electrode 130. For example, the pad portion PAD may have an upper surface that is higher than the remaining portions of the gate electrode 130. However, embodiments of the present inventive concept are not necessarily limited thereto.

In the connection region CON, the plurality of gate electrodes 130 may extend to have a shorter length in the first direction (X direction) as the distance of the gate electrode 130 increases away from the upper surface of the semiconductor substrate 101 in the third direction (Z direction). For example, in the connection region CON, the plurality of gate electrodes 130 may have a stair structure.

In the connection region CON, a contact plug CNT connected to the pad portion PAD by penetrating the cover insulating layer 120 may be arranged at a contact hole CNTH. In an embodiment, the contact plug CNT may have a tapered pillar shape in which a width of the contact plug CNT decreases (e.g., tapers off) from the upper portion towards the lower portion thereof in the third direction (Z direction).

In an embodiment, a plurality of dummy channel structures extending in the third direction (Z direction) by penetrating the gate stack GS in the connection region CON may be formed. The dummy channel structure may be formed to prevent bending or curving of the gate stack GS in the fabricating process of the integrated circuit device 100, and to increase the structural stability of the integrated circuit device 100.

In an embodiment, a bit line contact BLC may penetrate the upper insulating layer 150 and be in direct contact with the conductive plug 168 of the channel structure 160, and on the upper insulating layer 150, a bit line BL in direct contact with the bit line contact BLC may extend in the second direction (Y direction). Further, in the connection region CON, a conductive line ML may be formed on the upper insulating layer 150. In an embodiment, an upper support layer may be further formed between the upper insulating layer 150 and the bit line BL and between the upper insulating layer 150 and the conductive line ML.

The greater the height of the gate stack GS gets, the greater an aspect ratio of the channel structure 160, such as a ratio of height to width of the channel structure 160, may become. For example, in a structure in which the gate stack GS includes a plurality of gate electrodes 130, the aspect ratio of the channel structure 160 may become even greater. In addition to this, according to the characteristics of a dry etching process to form the channel hole 160H, the channel structure 160 may have a further tapered shape. Such a shape may cause an issue of decreasing structural and electrical properties of the channel structure 160.

Accordingly, as described below, the method of fabricating the integrated circuit device 100 may form a sacrificial film SL inside the tapered channel hole 160H (see FIG. 7C) and perform the oxidation process. In this manner, the channel hole 160H having a lateral wall substantially perpendicular to the semiconductor substrate 101 may be formed on the semiconductor substrate 101, which leads to an increase in the structural and electrical reliability of the channel structure 160.

The integrated circuit device 100 according to an aspect of the present inventive concept may increase the reliability and productivity of products even if the height of the gate stack GS increases, leading to an increased aspect ratio of the channel structure 160.

FIGS. 7A to 7I are cross-sectional views illustrating by step a method of fabricating an integrated circuit device, according to embodiments of the present inventive concept.

In these embodiments, examples of the method of fabricating the integrated circuit device 100 described with reference to FIGS. 3 to 6 are further provided. For convenience in explanation, FIG. 4 is partially illustrated.

The method of fabricating an integrated circuit device may include the following processes. Here, when an embodiment is implemented in some other way, certain processes may be performed in an order different from the order described herein. For example, two processes described sequentially may be performed substantially at the same time, or may be performed in a reverse order of the stated order.

Figure 7A:
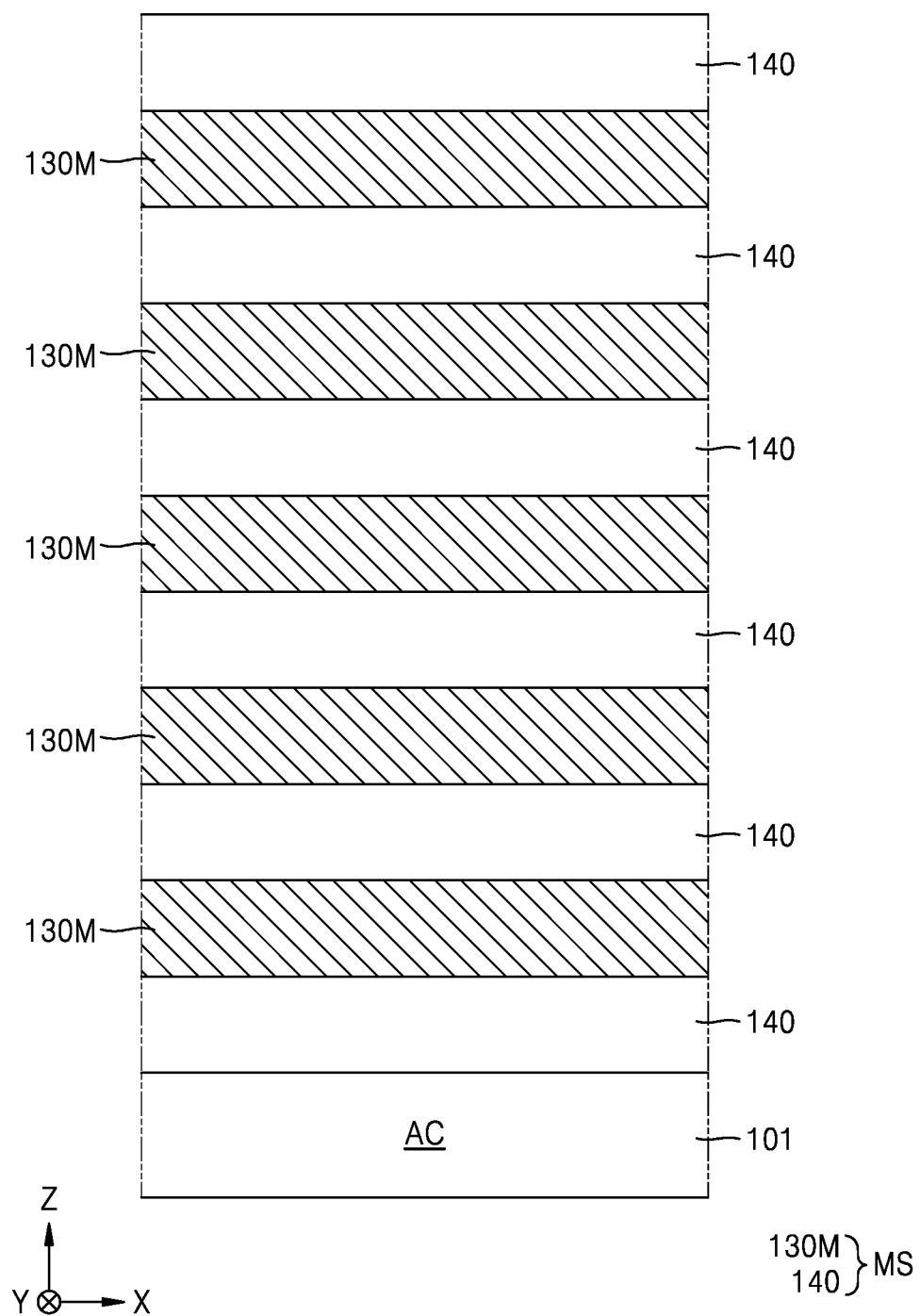
FIGS. 7A to 7I are cross-sectional views illustrating by step a method of fabricating an integrated circuit device, according to embodiments of the present inventive concept.

With reference to FIG. 7A, an active region AC may be defined in the semiconductor substrate 101, and a mold stack MS may be formed by alternately stacking the plurality of insulating layers 140 and a plurality of mold layers 130M.

For example, the plurality of insulating layers 140 and the plurality of mold layers 130M may be alternately arranged (e.g., in the third direction).

In an embodiment, the plurality of insulating layers 140 may include an insulator such as a silicon oxide, a silicon oxynitride, etc. The plurality of insulating layers 140 may include a material having an etch selectivity different from that of the plurality of mold layers 130M.

Each of the plurality of mold layers 130M may provide a space for forming the ground select line GSL, the plurality of word lines WL, and the plurality of string select lines SSL in the subsequent processes. Among the plurality of mold layers 130M, a first mold layer 130M from the semiconductor substrate 101 may provide a space for forming the ground select line GSL. In an embodiment, the plurality of mold layers 130M may include a silicon nitride, a silicon oxynitride, or polysilicon doped with impurities, etc.

In an embodiment, each of the plurality of insulating layers 140 and the plurality of mold layers 130M may be formed by chemical vapor deposition (CVD), plasma enhanced CVD (PECVD), or atomic layer deposition (ALD).

Figure 7B:
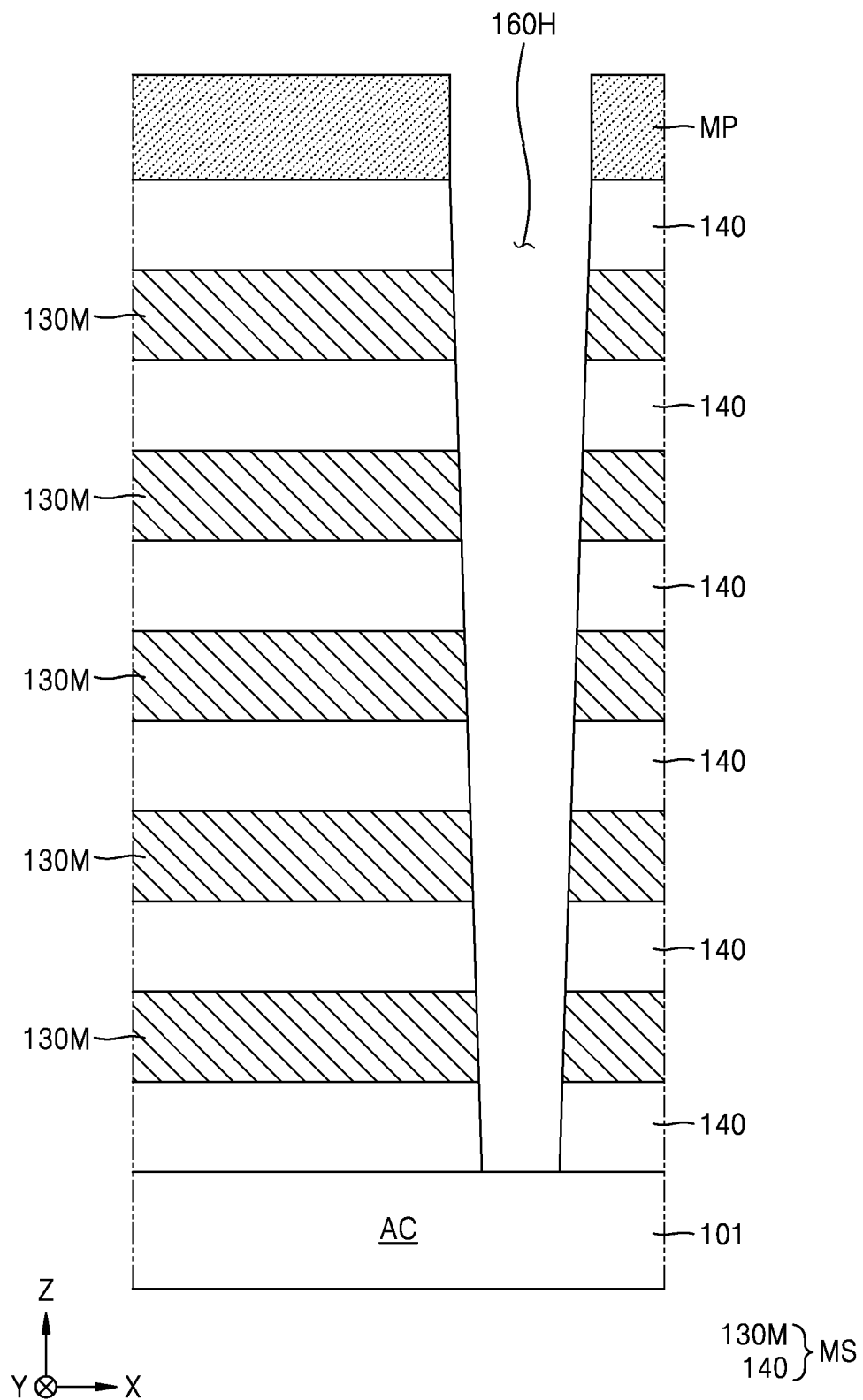

With reference to FIG. 7B, by etching the mold stack MS, the channel hole 160H exposing the semiconductor substrate 101 may be formed.

After forming a mask pattern MP having an opening on the mold stack MS, the channel hole 160H may be formed by using the mask pattern MP as an etching mask. In an embodiment, the mask pattern MP may be formed by photolithography. Further, the mask pattern MP may be removed after the etching process of the channel hole 160H is completed.

In an embodiment, immediately after the etching process is completed, a horizontal width of the channel hole 160H may taper off towards the semiconductor substrate 101. For example, the horizontal width of the channel hole 160H may continually decrease from an upper surface of the mold stack MS to the semiconductor substrate 101. This is due to the characteristics of the dry etching process during formation of the channel hole 160H having a high aspect ratio.

Figure 7C:
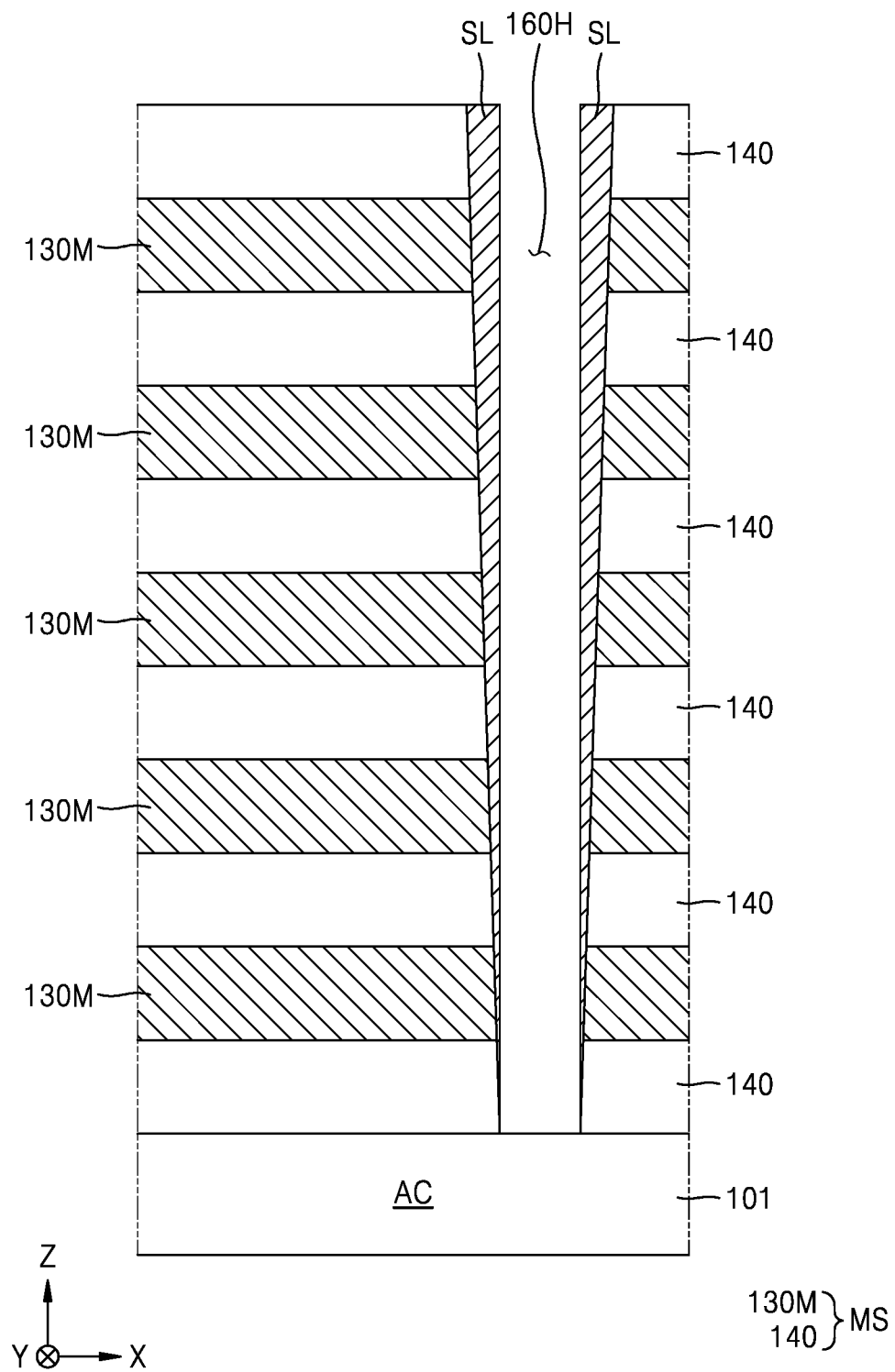

With reference to FIG. 7C, the sacrificial film SL may be formed on the lateral wall of the channel hole 160H to change the tapered shape of the channel hole 160H into a rectangular shape.

In an embodiment, the sacrificial film SL may include a material containing silicon (Si), for example, a silicon nitride, a silicon oxynitride, polysilicon, etc. The sacrificial film SL may be formed by CVD, PECVD, or ALD. However, embodiments of the present inventive concept are not necessarily limited thereto.

A horizontal width of the sacrificial film SL may be greater at the upper portion of the mold stack MS than at the lower portion of the mold stack MS. Accordingly, as a degree of tapering of the channel hole 160H may be compensated by the sacrificial film SL, the lateral wall of the channel hole 160H may be formed to be substantially perpendicular to the upper surface of the semiconductor substrate 101 in the third direction (Z direction).

Figure 7D:
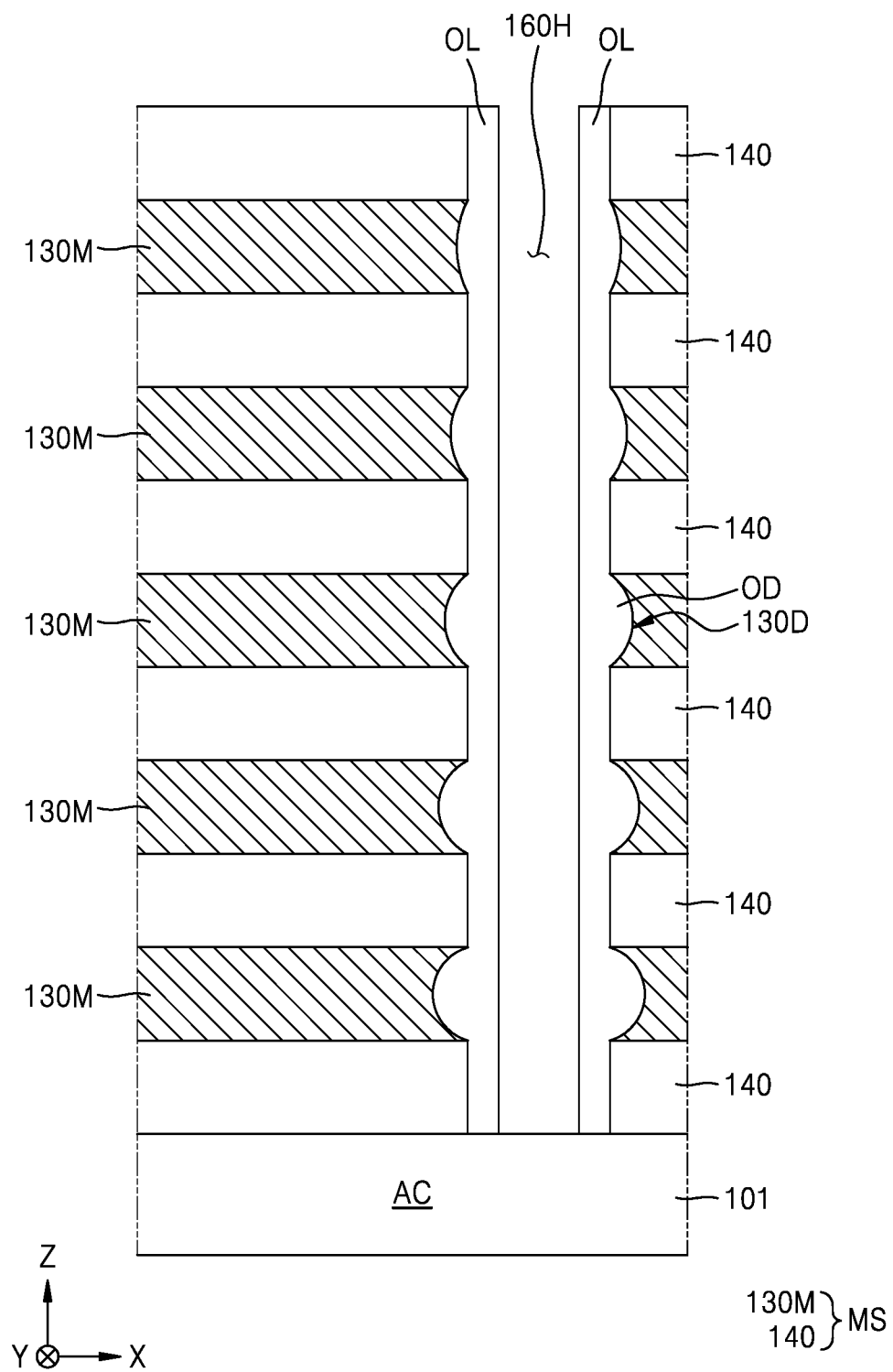

With reference to FIG. 7D, a radical oxidation process may be performed on the mold stack MS.

The radical oxidation process may be performed on the mold stack MS in which the sacrificial film SL (see FIG. 7C) is formed on the tapered lateral wall of the channel hole 160H. For example, in an embodiment, the oxidation process may be a radical oxidation process using remote plasma.

Due to the oxidation process, the sacrificial films SL (see FIG. 7C) may be entirely converted into sacrificial oxide films OL. Accordingly, after performing the etching process, the channel hole 160H may have a rectangular shape in which a horizontal width of the channel hole 160H is constant along the third direction (Z direction) from the upper surface of the semiconductor substrate 101. For example, the horizontal width of the sacrificial oxide films OL at an upper portion of the mold stack MS may be substantially identical to the horizontal width of the sacrificial oxide films OL at a lower portion of the mold stack MS.

In some embodiments, the sacrificial oxide film OL may include a plurality of round protrusions OD positioned along an outer wall thereof. The plurality of round protrusions OD may be formed to be in direct contact with the regions in which the plurality of mold layers 130M are arranged.

In an embodiment, a horizontal width of the sacrificial oxide film OL in direct contact with the insulating layer 140 at the upper portion of the mold stack MS may be substantially the same as a horizontal width of the sacrificial oxide film OL in direct contact with the insulating layer 140 at the lower portion of the mold stack MS. Also, an area (e.g., size) of an oxidized portion of the mold layer 130M at the upper portion of the mold stack MS may be less than an area (e.g., size) of an oxidized portion of the mold layer 130M at the lower portion of the mold stack MS.

The round recess 130D may be formed at an end of the plurality of mold layers 130M neighboring the channel hole 160H, and an area of the round recess 130D at the upper portion of the mold stack MS may be less than an area of the round recess 130D at the lower portion of the mold stack MS. Such a shape may be due to a difference in positions where the degree of tapering of the channel hole 160H is compensated by the sacrificial film SL (see FIG. 7C).

Figure 7E:
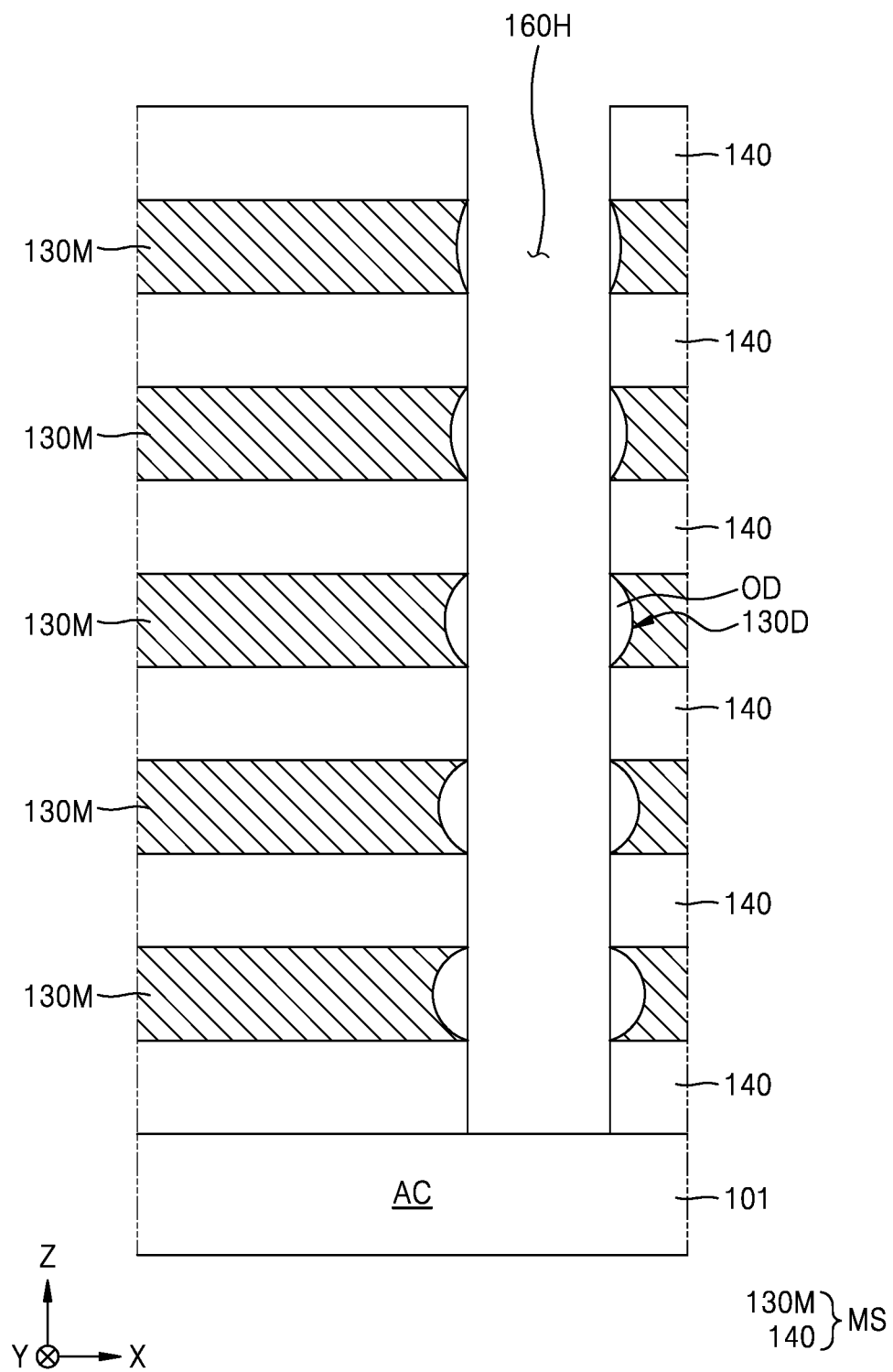

With reference to FIG. 7E, the sacrificial oxide film OL (see FIG. 7D) may be removed by performing an etching process for removal.

A process of vertically etching the sacrificial oxide film OL (see FIG. 7D) formed inside the channel hole 160H may be performed. For example, in an embodiment the vertical etching process may be a wet etching process using an etchant containing hydrofluoric acid. In some embodiments, the plurality of round protrusions OD may not be removed and remain at an end of the plurality of mold layers 130M. However, embodiments of the present inventive concept are not necessarily limited thereto. For example, in some embodiments, the plurality of round protrusions OD may be removed and the end of the plurality of mold layers 130M may be exposed.

After performing the etching process, the channel hole 160H may have a rectangular shape in which a horizontal width of the channel hole 160H is constant along the third direction (Z direction) from the upper surface of the semiconductor substrate 101 to an upper surface of the mold stack MS.

Figure 7F:
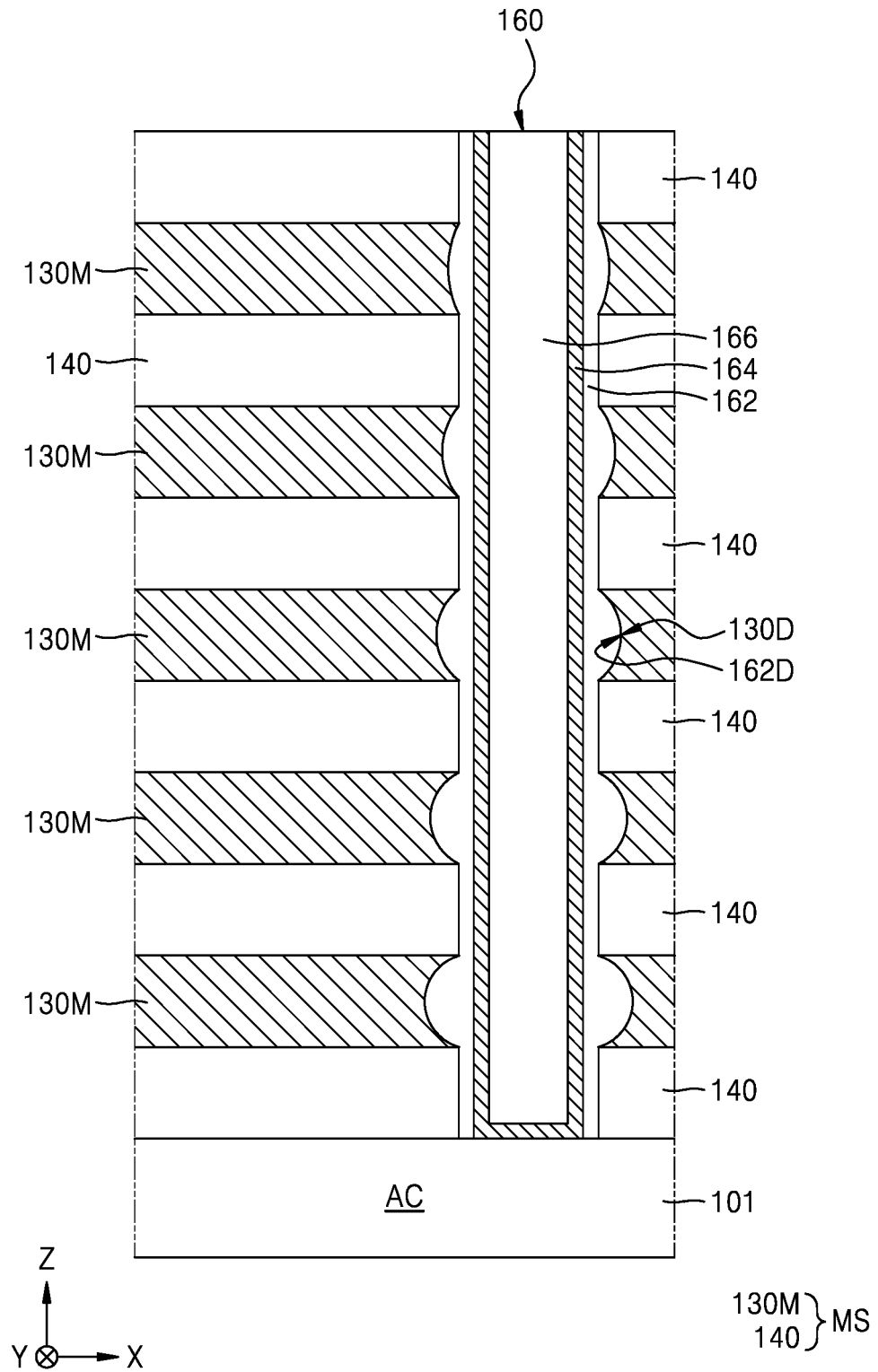

With reference to FIG. 7F, the channel structure 160 may be formed at the channel hole 160H.

The channel structure 160 may extend and be formed in the channel hole 160H penetrating the plurality of insulating layers 140 and the plurality of mold layers 130M. The channel structure 160 may include the gate insulating layer 162, the channel layer 164, and the buried insulating layer 166. The gate insulating layer 162 and the channel layer 164 may be sequentially arranged on a lateral wall of the channel hole 160H. For example, the gate insulating layer 162 may be conformally arranged on the lateral wall of the channel hole 160H, and the channel layer 164 may be conformally arranged on the lateral wall and a bottom of the channel hole 160H. The buried insulating layer 166 may be arranged to fill a remaining space of the channel hole 160H on the channel layer 164.

In some embodiments, the gate insulating layer 162 may be merged with the plurality of round protrusions OD (see FIG. 7E) to form the plurality of round protrusions 162D. However, embodiments of the present inventive concept are not necessarily limited thereto. For example, in some embodiments, the gate insulating layer 162 may be formed in an area formerly occupied by the plurality of round protrusions OD (see FIG. 7E) to form the plurality of round protrusions 162D. In this manner, the plurality of round protrusions 162D of the gate insulating layer 162 may be formed to oppose the round recess 130D of the plurality of mold layers 130M.

Figure 7G:
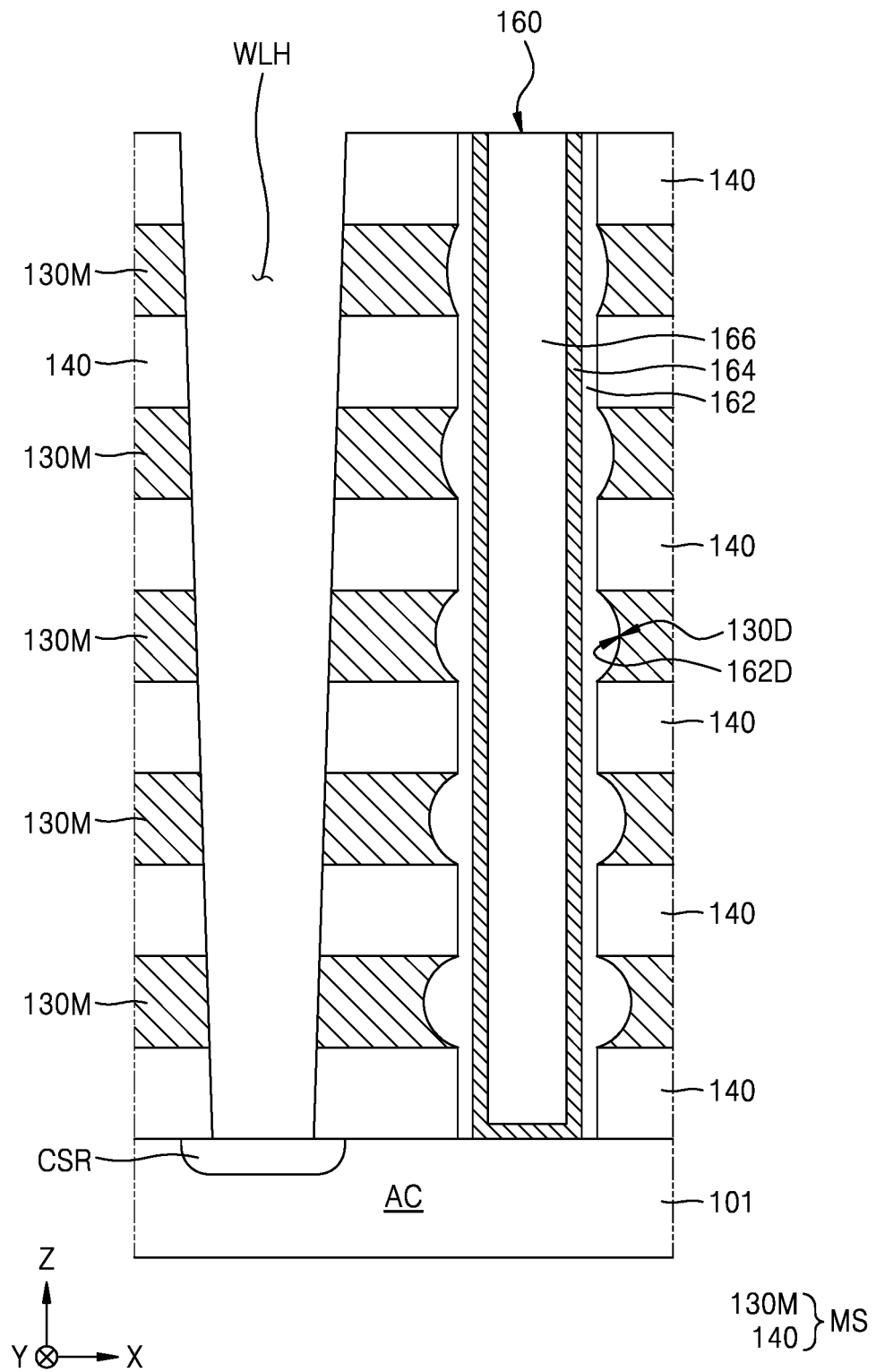

With reference to FIG. 7G, by partially etching the mold stack MS, the word line cut opening WLH may be formed.

After forming a mask pattern having an opening on the mold stack MS, by using the mask pattern as an etching mask, the word line cut opening WLH exposing the semiconductor substrate 101 by penetrating the plurality of insulating layers 140 and the plurality of mold layers 130M may be formed.

Then, the common source regions CSR may be formed by injecting impurity ions into the semiconductor substrate 101 exposed through the word line cut opening WLH.

Figure 7H:
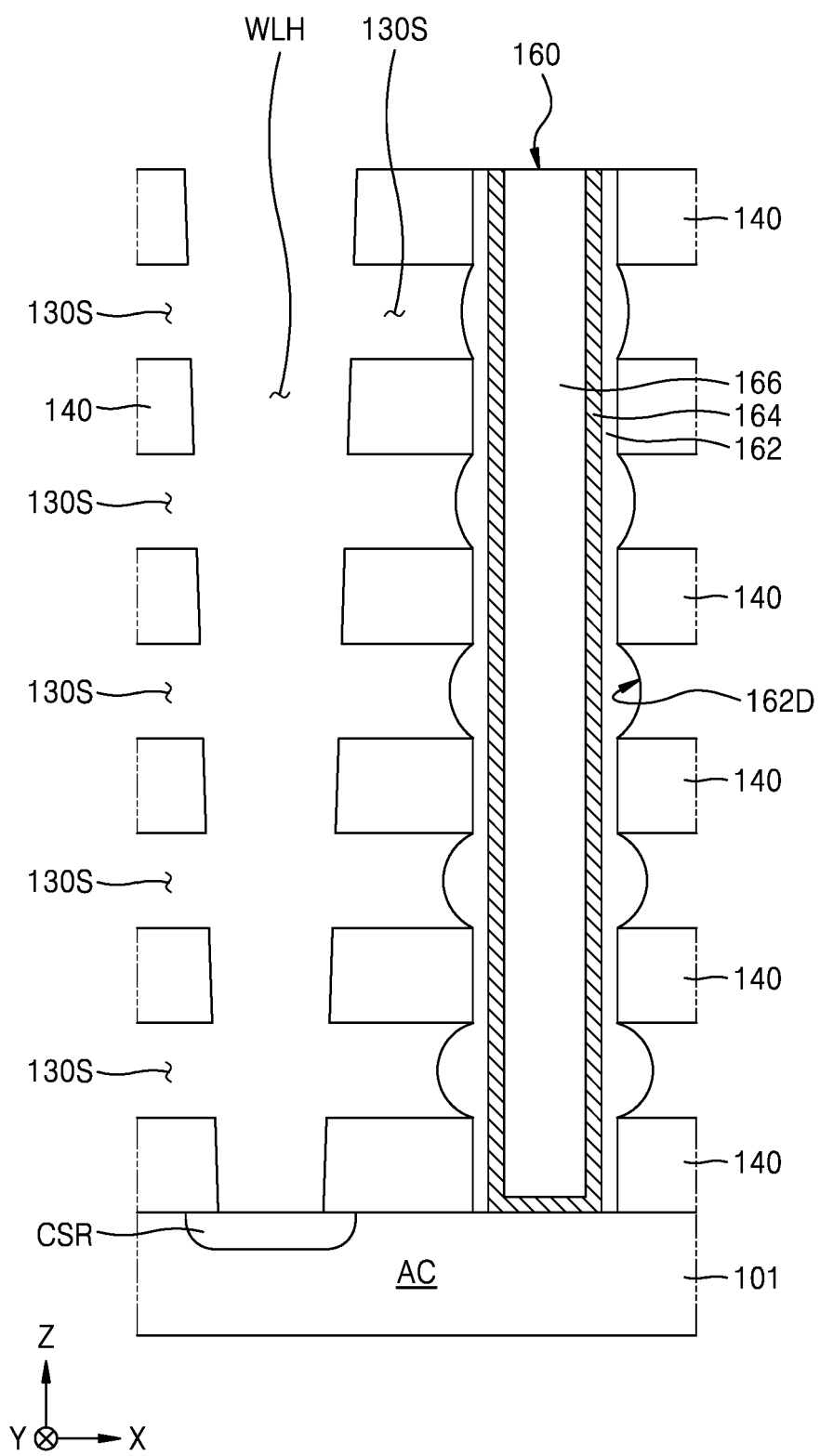

With reference to FIG. 7H, a plurality of gate spaces 130S may be formed by removing the plurality of mold layers 130M through the word line cut opening WLH.

Through the plurality of gate spaces 130S, each of the plurality of insulating layers 140 may be partially exposed.

The process of forming the plurality of gate spaces 130S may include a process of horizontally etching the plurality of mold layers 130M by using an etching recipe having an etch selectivity with respect to the plurality of insulating layers 140. For example, in an embodiment in which the plurality of mold layers 130M are silicon nitrides and the plurality of insulating layers 140 are silicon oxides, the vertical etching process may be a wet etching process using an etchant containing phosphoric acid. However, embodiments of the present inventive concept are not necessarily limited thereto.

Figure 7I:
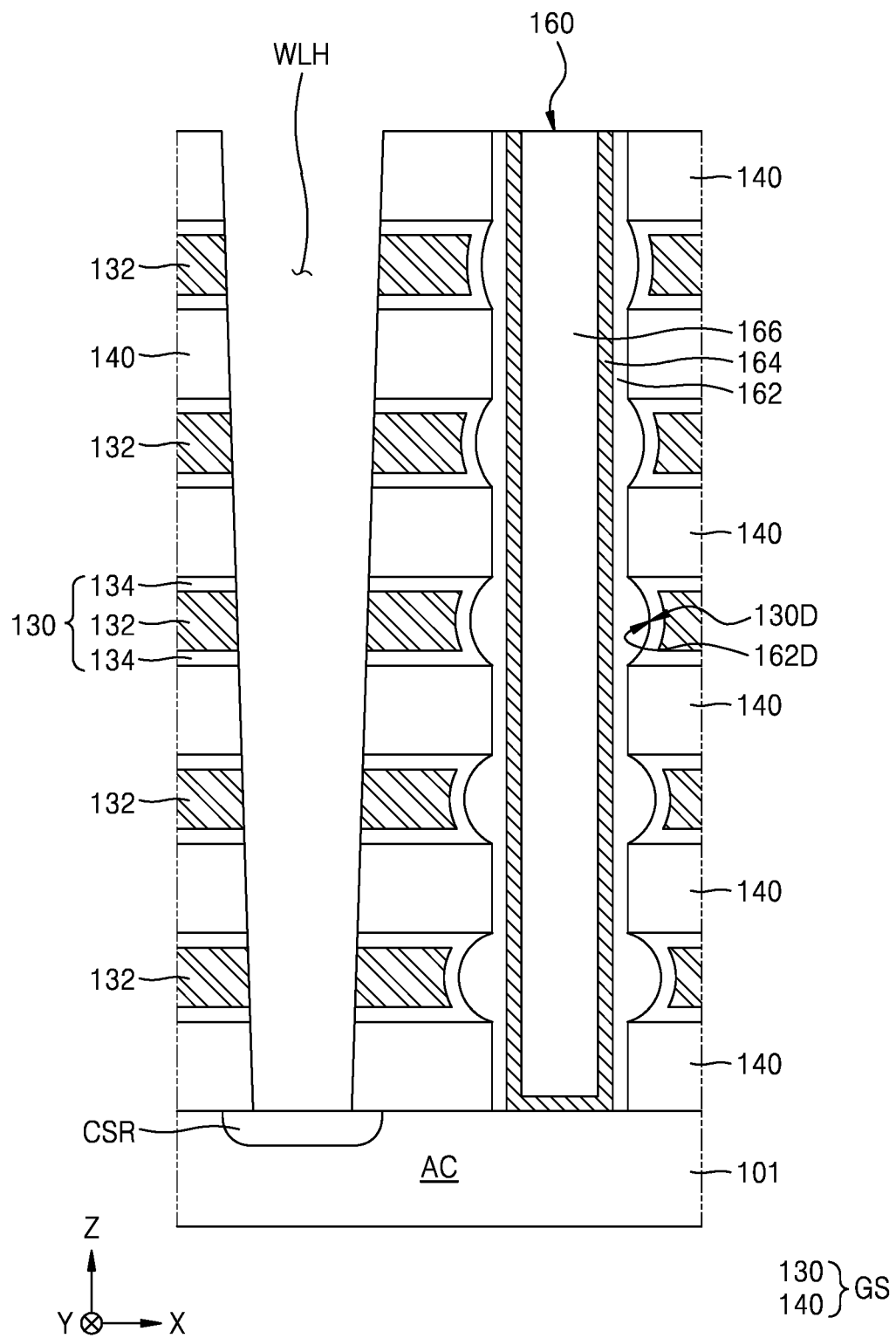

With reference to FIG. 7I, the plurality of gate electrodes 130 filling the plurality of gate spaces 130S (see FIG. 7H) may be formed to substitute the plurality of mold layers 130M that have been removed by the etching with the plurality of gate electrodes 130.

Each of the plurality of gate electrodes 130 may include the buried conductive layer 132 and the insulating liner 134 surrounding the buried conductive layer 132. The plurality of gate electrodes 130 and the plurality of insulating layers 140 may constitute the gate stack GS.

In a method of fabricating an integrated circuit device of an embodiment of the present inventive concept, each of the plurality of gate electrodes 130 may include the round recess 130D at the end adjacent to the channel structure 160. An area occupied by the round recess 130D at an upper portion of the gate stack GS may be less than an area occupied by the round recess 130D at a lower portion of the gate stack GS. For example, an end of the gate electrode 130 positioned at the lower portion of the gate stack GS may be relatively more recessed.

With reference to FIGS. 3-4, the integrated circuit device 100 according to an embodiment of the present inventive concept may be fabricated by forming the word line cut 170 in the word line cut opening WLH, forming the upper insulating layer 150, forming a plurality of bit line contacts BLC penetrating a portion of the upper insulating layer 150, and forming a plurality of bit lines BL connected to the plurality of bit line contacts BLC.

FIGS. 8 to 11 are cross-sectional views of an integrated circuit device according to an embodiment of the present inventive concept.

Most of the components of the integrated circuit devices (200, 300, and 400) and materials constituting the components described below are substantially identical or similar to those described above with reference to FIGS. 3 to 6. Accordingly, for convenience in explanation, embodiments are further described focusing on the difference with the integrated circuit device 100 described above. Further, FIG. 10 is an enlarged view of X region of FIG. 9.

Figure 8:
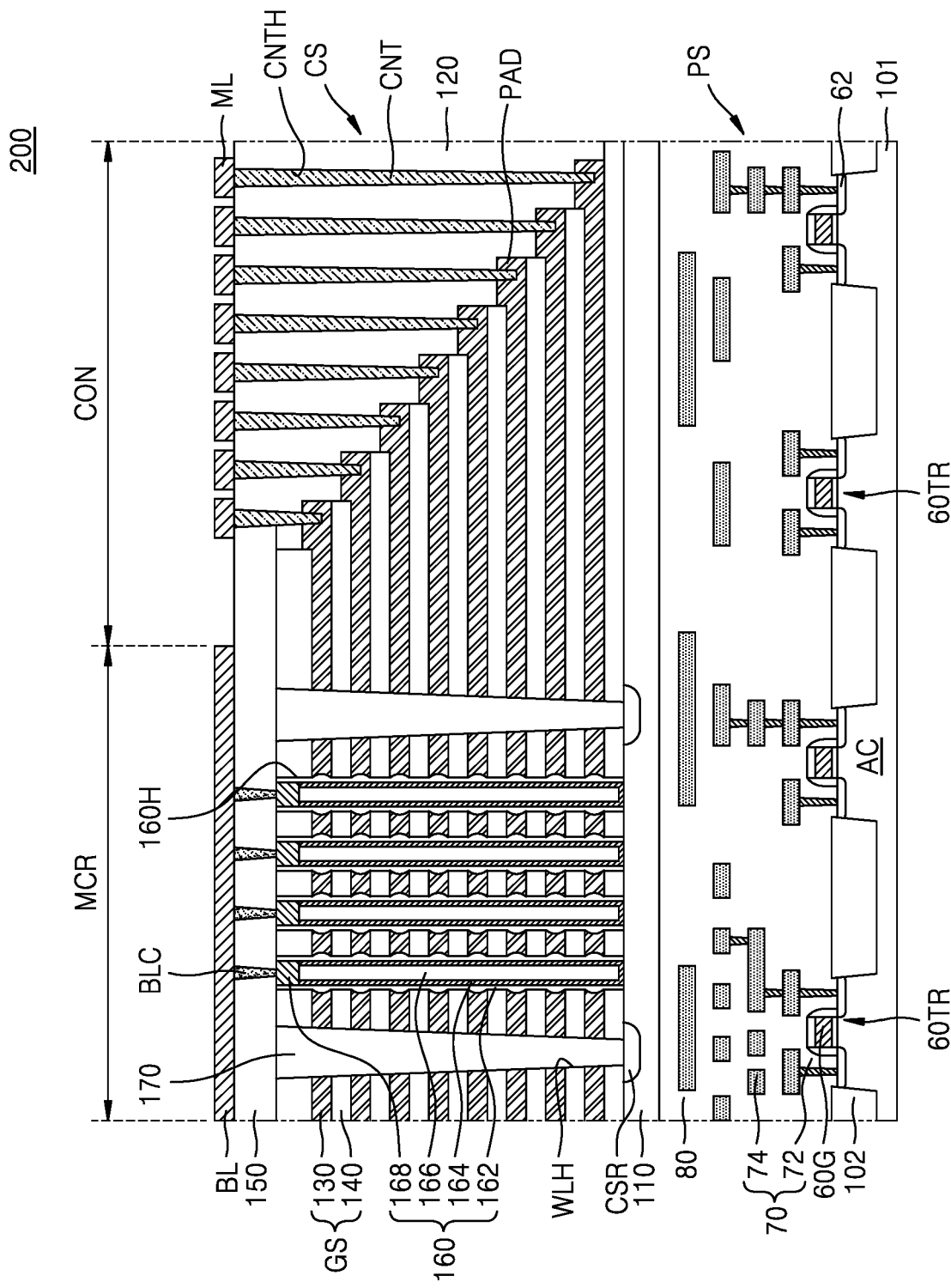
FIGS. 8 to 11 are cross-sectional views of an integrated circuit device according to embodiments of the present inventive concept.

With reference to an embodiment shown in FIG. 8, an integrated circuit device 200 may include a peripheral circuit structure PS and a cell array structure CS arranged at a vertical level (e.g., distance in the third direction from an upper surface of the substrate 101) higher than the peripheral circuit structure PS.

The integrated circuit device 200 of an embodiment shown in FIG. 8 may have a cell-on-periphery (COP) structure in which the cell array structure CS is arranged on the peripheral circuit structure PS. A base structure 110 may be arranged between the peripheral circuit structure PS and the cell array structure CS (e.g., in the third direction).

The peripheral circuit structure PS may include a peripheral circuit transistor 60TR and a peripheral circuit wire 70 arranged on the semiconductor substrate 101. The active region AC may be defined by a device separation film 102 in the semiconductor substrate 101, and the plurality of peripheral circuit transistors 60TR may be formed on the active region AC. The plurality of peripheral circuit transistors 60TR may include a peripheral circuit gate 60G and a source/drain region 62 arranged at a portion of the semiconductor substrate 101 on either side of the peripheral circuit gate 60G.

In an embodiment, the peripheral circuit wire 70 may include a plurality of peripheral circuit contacts 72 and a plurality of peripheral circuit metal layers 74. An interlayer insulating film 80 may be arranged on the semiconductor substrate 101 to cover the peripheral circuit transistor 60TR and the peripheral circuit wire 70. The plurality of peripheral circuit metal layers 74 may have a multilayer structure including a plurality of metal layers arranged at different vertical levels. In an embodiment shown in FIG. 8, the plurality of peripheral circuit metal layers 74 are shown as having the same height (e.g., length in the third direction); however, unlike such description, peripheral circuit metal layers 74 arranged at a certain level (e.g., at the uppermost level) may have a greater height than peripheral circuit metal layers 74 arranged at the rest of the levels.

The integrated circuit device 200 fabricated by a method of fabricating an integrated circuit device, according to an embodiment of the present inventive concept, may increase the structural and electrical reliability of the channel structure 160 by forming on the semiconductor substrate 101 the channel hole 160H having a lateral wall substantially perpendicular to the semiconductor substrate 101.

Figure 9:
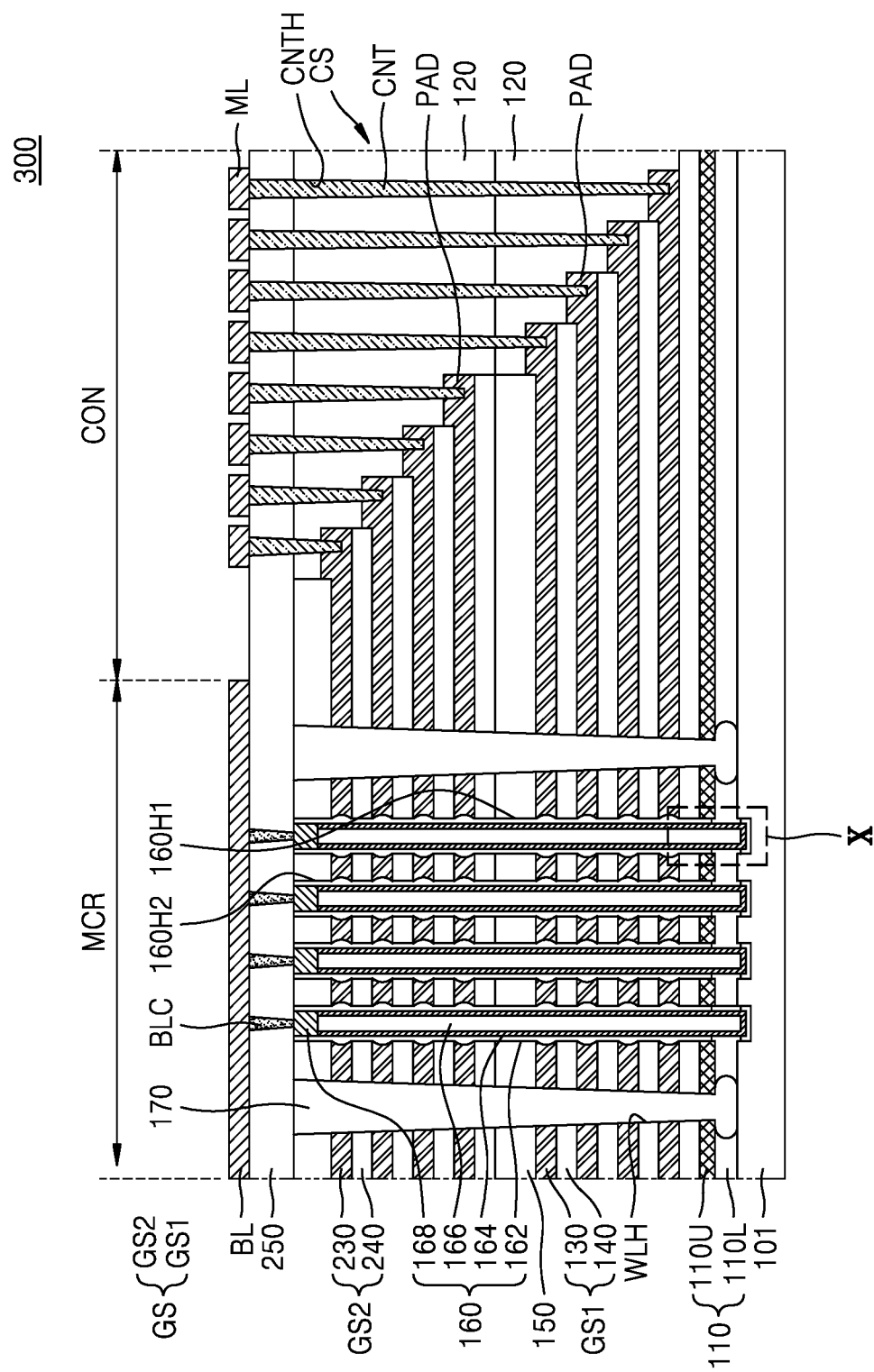
Figure 10:
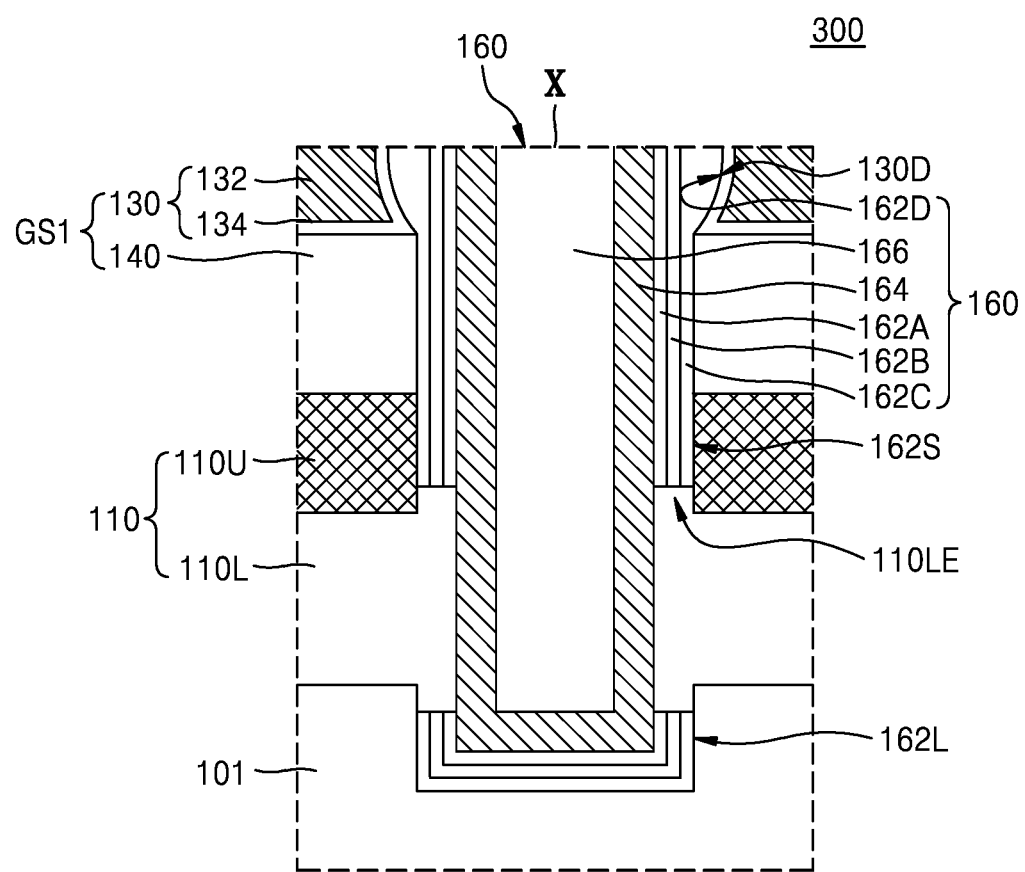

With reference to FIGS. 9 and 10, an integrated circuit device 300 may include a first gate stack GS1 at a lower portion of the integrated circuit device 300 and a second gate stack GS2 at an upper portion of the integrated circuit device 300.

In the integrated circuit device 300 of the embodiment, the first gate stack GS1 may include a plurality of first gate electrodes 130 and a plurality of first insulating layers 140, and the plurality of first gate electrodes 130 and the plurality of insulating layers 140 may be alternately arranged in the third direction (Z direction) perpendicular to an upper surface of the base structure 110. Further, a first upper insulating layer 150 may be arranged at the top of the first gate stack GS1.

The second gate stack GS2 may include a plurality of second gate electrodes 230 and a plurality of second insulating layers 240, and the plurality of second gate electrodes 230 and the plurality of second insulating layers 240 may be arranged alternately on the first gate stack GS1 in the third direction (Z direction). Further, a second upper insulating layer 250 may be arranged at the top of the second gate stack GS2. Also, in the connection region CON, the first gate stack GS1 may have a first stair structure in which the plurality of first gate electrodes 130 extend to have a shorter length in a direction parallel to an upper surface of the semiconductor substrate 101 as the distance of the first gate electrode 130 increases from the upper surface of the semiconductor substrate 101 in the third direction (Z direction), and the second gate stack GS2 may have a second stair structure in which the plurality of second gate electrodes 230 extend to have a shorter length in a direction parallel to an upper surface of the semiconductor substrate 101 as the distance of the second gate electrode 230 increases away from the upper surface of the semiconductor substrate 101 in the third direction (Z direction).

The plurality of channel structures 160 may extend and be formed in a first channel hole 160H1 penetrating the first gate stack GS1 and a second channel hole 160H2 penetrating the second gate stack GS2. The plurality of channel structures 160 may have a lateral wall substantially vertical at a boundary between the first channel hole 160H1 and the second channel hole 160H2.

The plurality of channel structures 160 may be in direct contact with the semiconductor substrate 101 by penetrating the base structure 110 including an upper base layer 110U and a lower base layer 110L. A part of the gate insulating layer 162 may be removed at the same level as the lower base layer 110L, and the channel layer 164 may be in direct contact with an extension portion 110LE of the lower base layer 110L. A lateral wall portion 162S and a bottom portion 162L of the gate insulating layer 162 may be spaced apart from each other with the extension portion 110LE of the lower base layer 110L arranged therebetween (e.g., in the third direction), and the bottom portion 162L of the gate insulating layer 162 may surround a bottom surface of the channel layer 164. Accordingly, the channel layer 164 may be electrically connected to the lower base layer 110L instead of being directly in contact with the semiconductor substrate 101.

The integrated circuit device 300 fabricated by a method of fabricating an integrated circuit device, according to an embodiment of the present inventive concept, may increase the structural and electrical reliability of the channel structure 160 by forming on the semiconductor substrate 101 the first channel hole 160H1 and the second channel hole 160H2 having a lateral wall substantially perpendicular to the semiconductor substrate 101.

Figure 11:
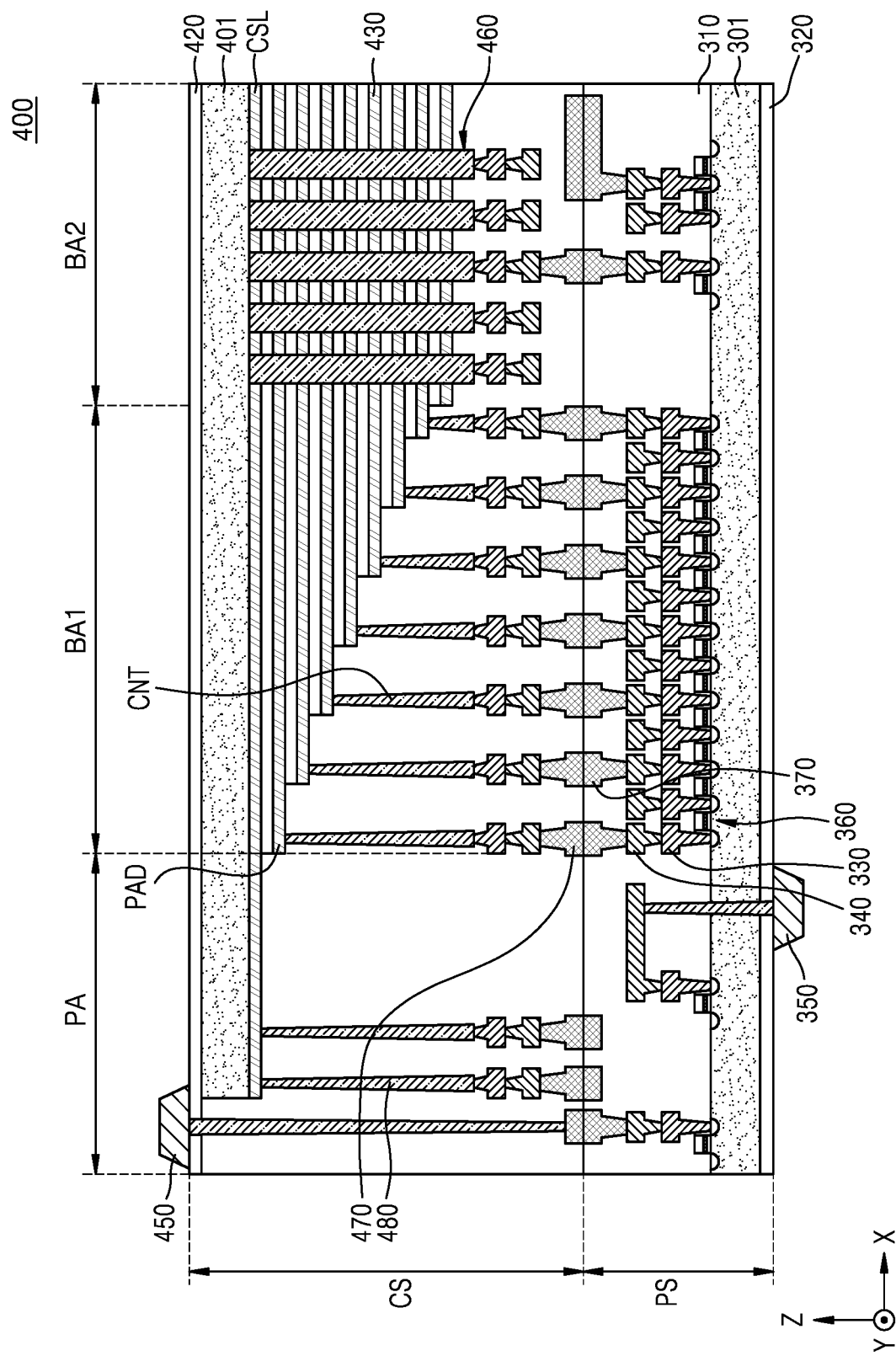

With reference to FIG. 11, an integrated circuit device 400 may include a chip-to-chip structure.

The integrated circuit device 400 of an embodiment shown in FIG. 11 may include the chip-to-chip structure in which after an upper chip including a cell array structure CS and a lower chip including a peripheral circuit structure PS are fabricated, the upper chip and the lower chip are bonded to each other.

In some embodiments, the bonding may refer to a contact between a bonding pad formed at the uppermost portion of the upper chip and a bonding pad formed at the uppermost portion of the lower chip. In an embodiment, the bonding method may include a metal-metal bonding structure, a through silicon via (TSV), a back via stack (BVS), a eutectic bonding structure, a ball grid array bonding (BGA) structure, a plurality of wiring lines, or a combination thereof.

The peripheral circuit structure PS may include a circuit board 301, an interlayer insulating layer 310, a plurality of circuit devices 360, a first metal layer 330 connected to each of the plurality of circuit devices 360, and a second metal layer 340 formed on the first metal layer 330.

The interlayer insulating layer 310 may be arranged to cover the plurality of circuit devices 360, the first metal layer 330, and the second metal layer 340, and includes an insulator.

A lower bonding pad 370 may be formed on the second metal layer 340 in a word line bonding area BA1. In the word line bonding area BA1, the lower bonding pad 370 of the peripheral circuit structure PS may be electrically connected to an upper bonding pad 470 of the cell array structure CS through bonding.

The cell array structure CS may provide at least one memory block. The cell array structure CS may include a cell substrate 401 and a common source line CSL. A plurality of word lines 430 may be stacked on the cell substrate 401 in the third direction (Z direction).

In a bit line bonding area BA2, a channel structure 460 may penetrate the word lines 430, string select lines, and a ground select line.

In the word line bonding area BA1, the word lines 430 may extend parallel to an upper surface of the cell substrate 401, and each of the word lines 430 may be respectively connected to one of the plurality of contact plugs CNT. As for the word lines 430 and the plurality of contact plugs CNT, the word lines 430 may extend in different lengths in the direction parallel to the upper surface of the cell substrate 401 to directly contact the contact plugs CNT at the provided pad portion PAD.

A common source line contact 480 may be arranged in an external pad bonding area PA. In an embodiment, the common source line contact 480 may include a conductive material such as a metal, a metal complex, polysilicon, etc., and may be electrically connected to the common source line CSL.

A first input/output pad 350 and a second input/output pad 450 may be arranged in the external pad bonding area PA. A lower film 320 to cover a lower surface of the circuit board 301 may be formed below the circuit board 301, and the first input/output pad 350 may be formed on the lower film 320. An upper film 420 to cover an upper surface of the cell substrate 401 may be formed on the cell substrate 401, and the second input/output pad 450 may be formed on the upper film 420.

The integrated circuit device 400 fabricated by a method of fabricating an integrated circuit device, according to an embodiment of the present inventive concept, may increase the structural and electrical reliability of the channel structure 460 by forming on the cell substrate 401 the channel hole having a lateral wall substantially perpendicular to the cell substrate 401.

Figure 12:
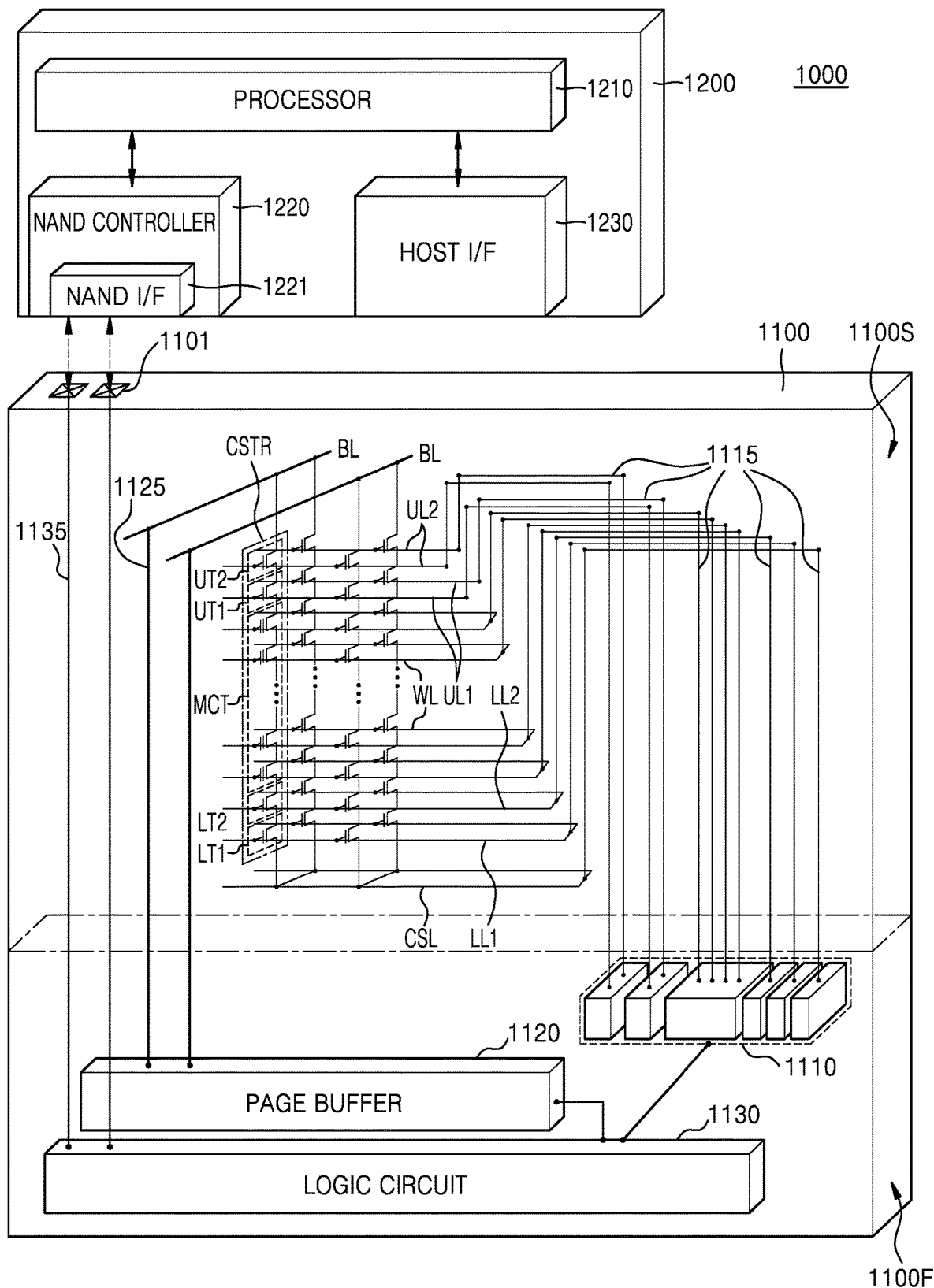
FIG. 12 is a diagram illustrating an electronic system including an integrated circuit device according to an embodiment of the present inventive concept.

FIG. 12 is a diagram illustrating an electronic system including an integrated circuit device according to an embodiment.

With reference to FIG. 12, an electronic system 1000 according to an embodiment of the present inventive concept may include an integrated circuit device 1100 and a controller 1200 electrically connected to the integrated circuit device 1100.

In an embodiment, the electronic system 1000 may be a storage device including one or more integrated circuit devices 1100 or an electronic device including a storage device. For example, the electronic system 1000 may be a solid state drive (SSD) device, a universal serial bus (USB) device, a computing system, a medical device, or communication device including at least one integrated circuit device 1100.

The integrated circuit device 1100 may be a non-volatile vertical memory device. For example, the integrated circuit device 1100 may be a NAND flash memory device including at least one of the integrated circuit devices (100, 200, 300, and 400) described above with reference to FIGS. 3 to 11. The integrated circuit device 1100 may include a first structure 1100F and a second structure 1100S on the first structure 1100F. In some embodiments, the first structure 1100F may be arranged next to the second structure 1100S.

In an embodiment, the first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, a first gate upper line UL1, a second gate upper line UL2, a first gate lower line LL1, a second gate lower line LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may vary according to embodiments of the present inventive concept and is not limited to those illustrated in an embodiment of FIG. 12.

In some embodiments, the upper transistors UT1 and UT2 may include a string select transistor, and the lower transistors LT1 and LT2 may include a ground select transistor. Each of the first and second gate lower lines LL1 and LL2 may be a gate electrode of the lower transistors LT1 and LT2. The word line WL may be a gate electrode of the memory cell transistor MCT, and the first and second gate upper lines UL1 and UL2 may be a gate electrode of the upper transistors UT1 and UT2.

The common source line CSL, the first and second gate lower lines LL1 and LL2, the plurality of word lines WL, and the first and second gate upper lines UL1 and UL2 may be electrically connected to the decoder circuit 1110 through a plurality of first connection wires 1115 extending from the inside of the first structure 1100F to the second structure 1100S. The plurality of bit lines BL may be electrically connected to the page buffer 1120 through a plurality of second connection wires 1125 extending from the inside of the first structure 1100F to the second structure 1100S.

In an embodiment, in the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The integrated circuit device 1100 may communicate with the controller 1200 through at least one input/output pad 1101 electrically connected to the logic circuit 1130. The input/output pad 1101 may be electrically connected to the logic circuit 1130 through an input/output connection wire 1135 extending from the inside of the first structure 1100F to the second structure 1100S.

In an embodiment, the controller 1200 may include a processor 1210, a NAND controller 1220, and a host interface 1230 (HOST I/F). In some embodiments, the electronic system 1000 may include a plurality of integrated circuit devices 1100, and in such embodiment, the controller 1200 may control the plurality of integrated circuit devices 1100.

The processor 1210 may control overall operations of the electronic system 1000 including the controller 1200. The processor 1210 may operate according to a certain firmware, and may control the NAND controller 1220 to access the integrated circuit device 1100. The NAND controller 1220 may include a NAND interface 1221 (NAND I/F) configured to process communication with the integrated circuit device 1100. Through the NAND interface 1221, a control command to control the integrated circuit device 1100, data to be recorded to the plurality of memory cell transistors MCT of the integrated circuit device 1100, data to be read from the plurality of memory cell transistors MCT of the integrated circuit device 1100, etc. may be transmitted. The host interface 1230 may provide a communication function between the electronic system 1000 and an external host. When a control command is received from the external host through the host interface 1230, the processor 1210 may control the integrated circuit device 1100 in response to the control command.

Figure 13:
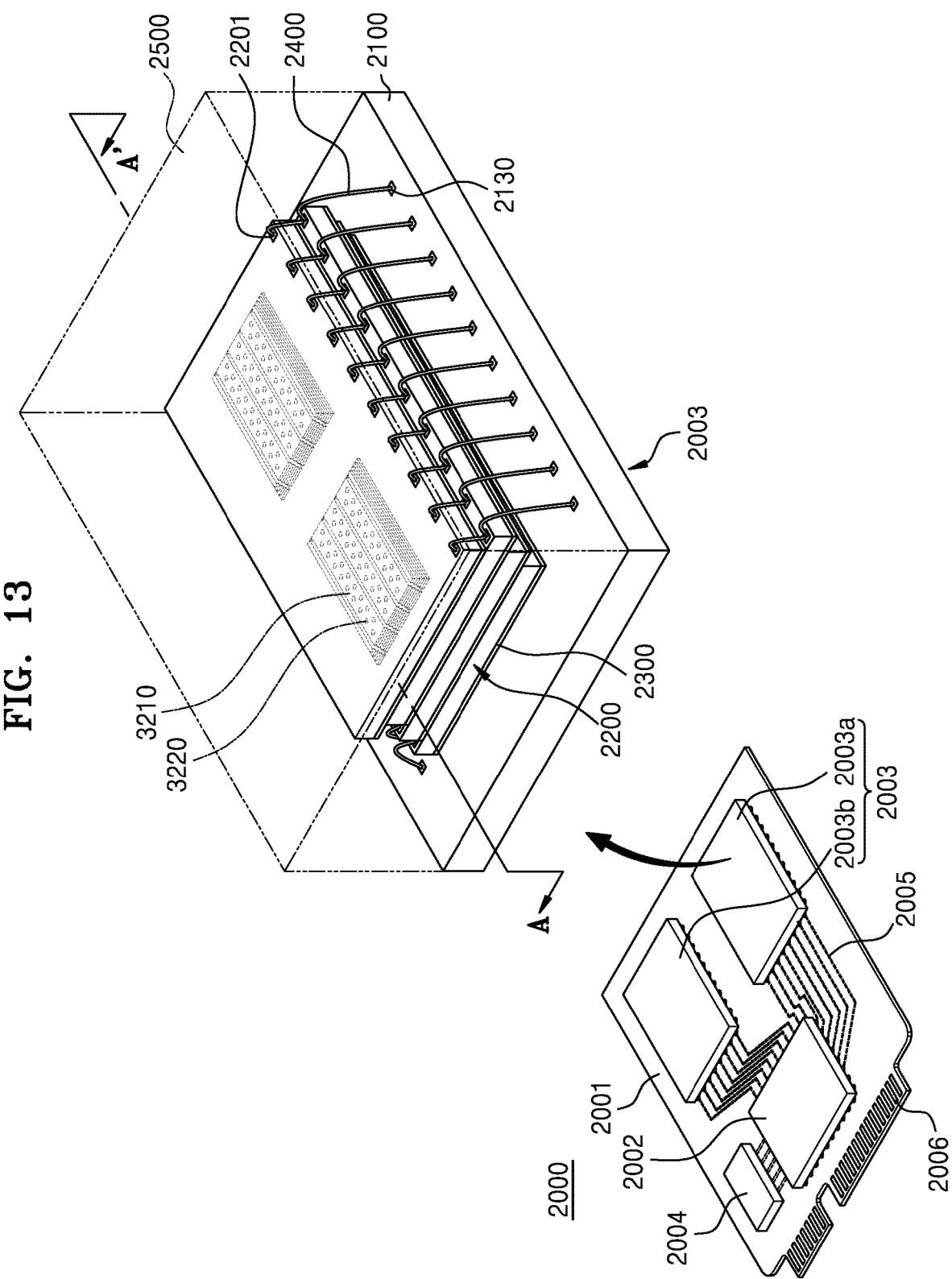
FIG. 13 is a perspective view illustrating an electronic system fabricated by a method of fabricating an electronic system including an integrated circuit device according to an embodiment of the present inventive concept.

FIG. 13 is a perspective view illustrating an electronic system fabricated by a method of fabricating an electronic system including an integrated circuit device according to an embodiment.

With reference to FIG. 13, an electronic system 2000 according to an embodiment of the present inventive concept may include a main substrate 2001, a controller 2002 mounted on the main substrate 2001, one or more semiconductor packages 2003, and dynamic random access memory (DRAM) 2004.

In an embodiment, the main substrate 2001 may include a connector 2006 including a plurality of pins to be engaged with an external host. The number and arrangement of the plurality of pins in the connector 2006 may vary according to a communication interface between the electronic system 2000 and the external host. In some embodiments, the electronic system 2000 may communicate with an external host according to one of interfaces including USB, peripheral component interconnect express (PCI-Express), serial advanced technology attachment (SATA), M-Phy for universal flash storage (UFS), etc. In some embodiments, the electronic system 2000 may be operated by power provided from the external host through the connector 2006. In an embodiment, the electronic system 2000 may further include a power management integrated circuit (PMIC) configured to distribute the power provided from the external host to the controller 2002 and the semiconductor packages 2003. The semiconductor package 2003 and the DRAM 2004 may be connected to the controller 2002 by a plurality of wire patterns 2005 formed on the main substrate 2001.

The controller 2002 may record data to the semiconductor package 2003, read data from the semiconductor package 2003, and increase an operation speed of the electronic system 2000.

The DRAM 2004 may be buffer memory to relieve a speed difference between the semiconductor packages 2003, which is a space for storing data, and the external host. The DRAM 2004 included in the electronic system 2000 may operate as certain type of cache memory, and provide a space for temporarily storing data during a control operation on the semiconductor package 2003. In an embodiment in which the DRAM 2004 is included in the electronic system 2000, the controller 2002 may further include a DRAM controller to control the DRAM 2004 in addition to a NAND controller to control the semiconductor package 2003.

The semiconductor package 2003 may include a first semiconductor package 2003a and a second semiconductor package 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, a plurality of semiconductor chips 2200 on the package substrate 2100, an adhesive layer 2300 arranged at an lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a print circuit board including a plurality of package upper pads 2130. Each of the plurality of semiconductor chips 2200 may include an input/output pad 2201. The input/output pad 2201 may correspond to the input/output pad 1101 of FIG. 12. Each of the plurality of semiconductor chips 2200 may include a plurality of gate stacks 3210 and a plurality of channel structures 3220. The plurality of semiconductor chips 2200 may include at least one of the integrated circuit devices (100, 200, 300, and 400) described above with reference to embodiments shown in FIGS. 3 to 11.

In some embodiments, the connection structure 2400 may be a bonding wire electrically connecting the input/output pad 2201 to the package upper pad 2130. Accordingly, in the first and second semiconductor packages 2003a and 2003b, the plurality of semiconductor chips 2200 may be connected to each other by the bonding wire method, and may be electrically connected to the package upper pad 2130 of the package substrate 2100. In some embodiments, in the first and second semiconductor packages 2003a and 2003b, the plurality of semiconductor chips 2200 may be electrically connected to each other by a connection structure including a through silicon via (TSV) instead of the connection structure 2400 of the bonding wire method.

In some embodiments, the controller 2002 and the plurality of semiconductor chips 2200 may be included in one package. In some embodiments, the controller 2002 and the plurality of semiconductor chips 2200 may be mounted on a separate interposer substrate that is different from the main substrate 2001, and the controller 2002 and the plurality of semiconductor chips 2200 may be connected to each other by a wire formed on the interposer substrate.

Figure 14:
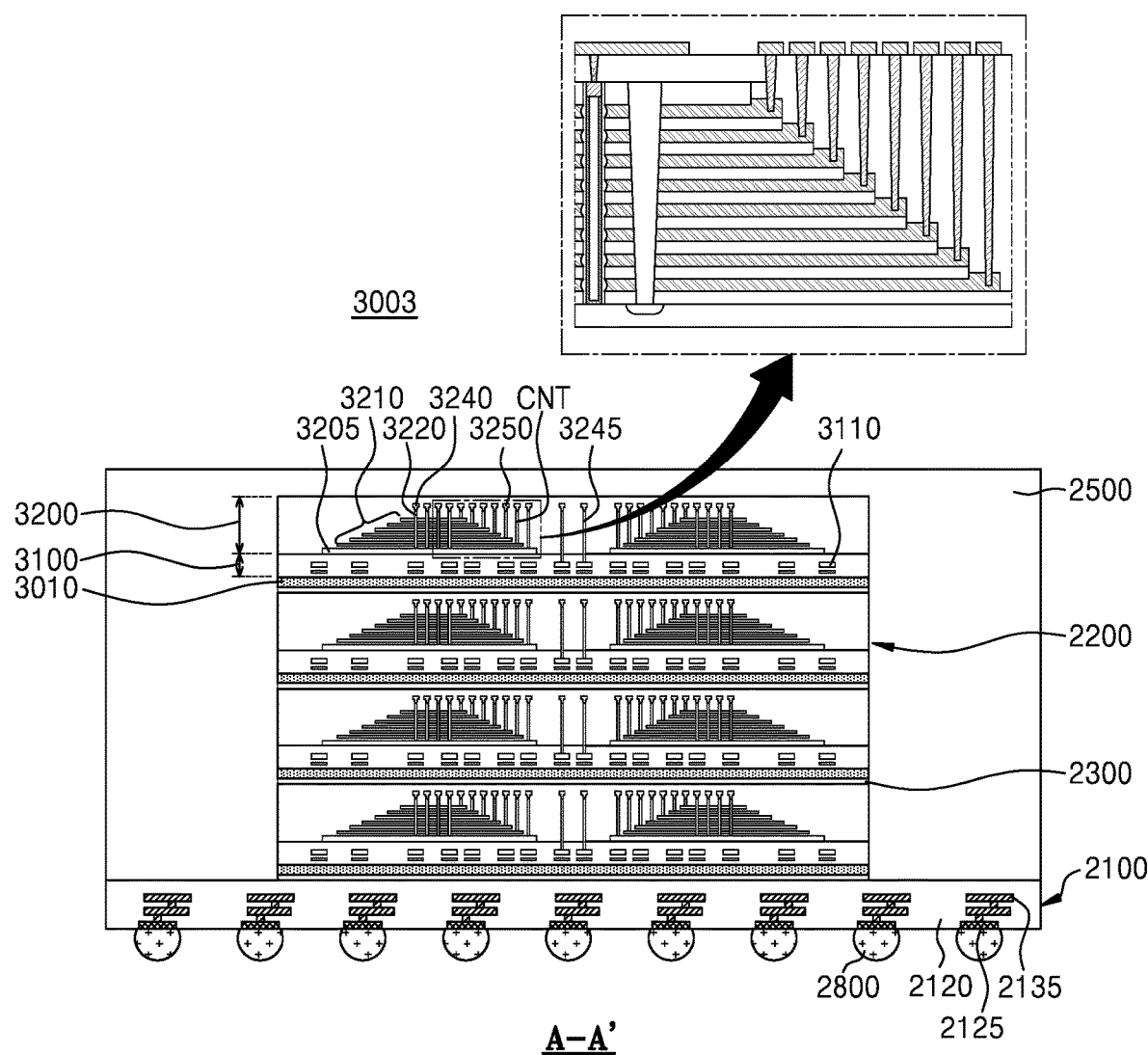
FIGS. 14 and 15 are cross-sectional views illustrating a semiconductor package including an integrated circuit device according to embodiments of the present inventive concept.
Figure 15:
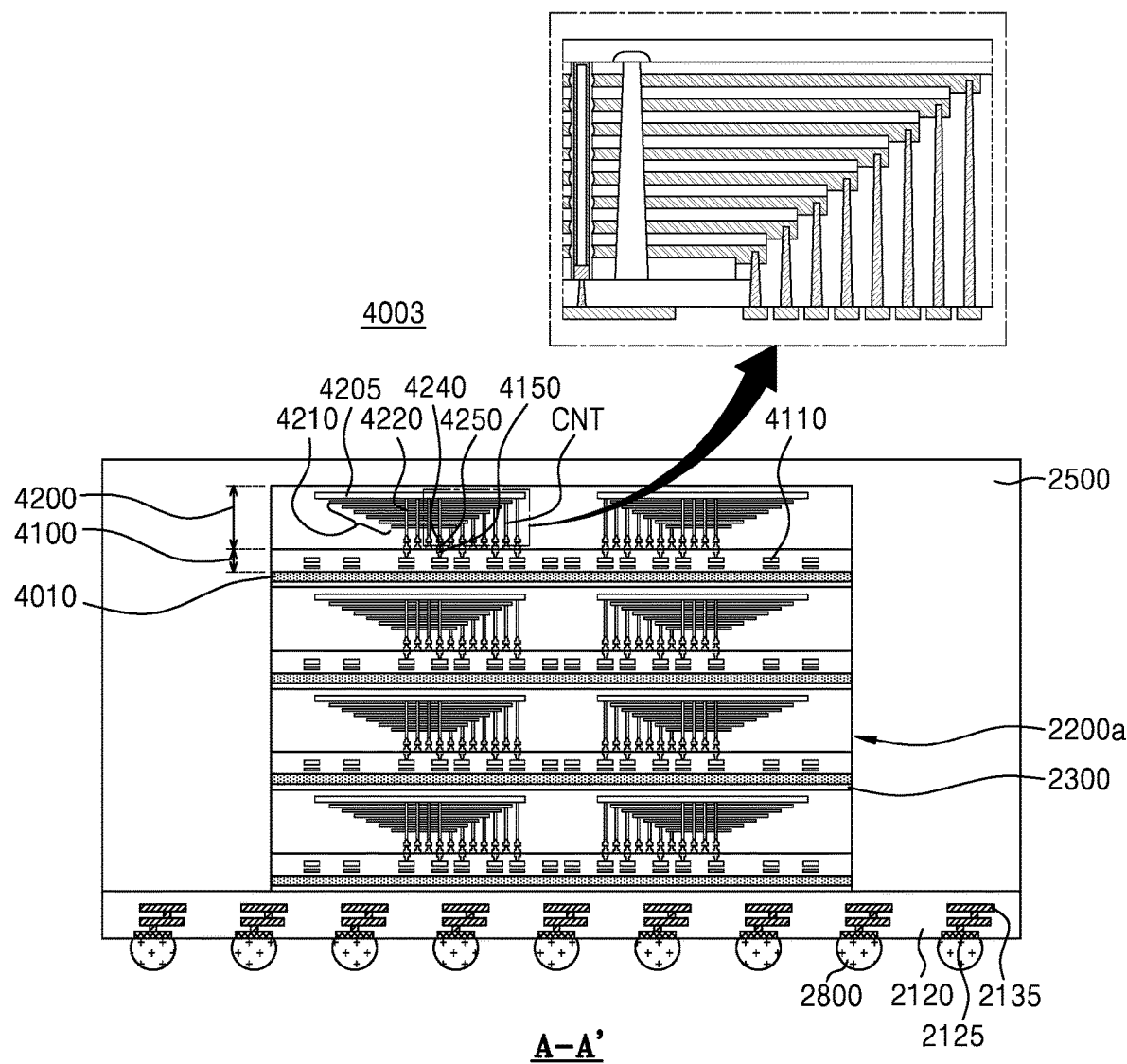

FIGS. 14 and 15 are cross-sectional views illustrating a semiconductor package including an integrated circuit device according to embodiments of the present inventive concept.

FIGS. 14 and 15 illustrate in detail configuration of the cross-sectional view taken along A-A' of FIG. 13.

With reference to FIG. 14, in a semiconductor package 3003, the package substrate 2100 may be a print circuit board.

The package substrate 2100 may include a body portion 2120, a plurality of upper pads 2130 (see FIG. 13) arranged on an upper surface of the body portion 2120, a plurality of lower pads 2125 arranged on a lower surface of the body portion 2120 or exposed through the lower portion, and a plurality of internal wires 2135 electrically connecting the plurality of upper pads 2130 and the plurality of lower pads 2125 in the body portion 2120. The plurality of upper pads 2130 may be electrically connected to the plurality of connection structures 2400 (see FIG. 13). The plurality of lower pads 2125 may be connected to the plurality of wire patterns 2005 on the main substrate 2001 of the electronic system 2000 provided as an example in FIG. 13 through a plurality of conductive connection portions 2800.

Each of the plurality of semiconductor chips 2200 may include a semiconductor substrate 3010, a first structure 3100 and a second structure 3200 sequentially stacked on the semiconductor substrate 3010 (e.g., in the third direction). The first structure 3100 may include a peripheral circuit region including a plurality of peripheral wires 3110. The first structure 3100 may include the peripheral circuit transistor 60TR as described with reference to an embodiment shown in FIG. 8. Although the first structure 3100 is described in the drawings as having the same structure as the peripheral circuit region of the integrated circuit device 200 as shown in an embodiment of FIG. 8, embodiments of the present inventive concept are not necessarily limited thereto.

The second structure 3200 may include a common source line 3205, a gate stack 3210 on the common source line 3205, a channel structure 3220 penetrating the gate stack 3210, and a bit line 3240 electrically connected to the channel structure 3220. The gate stack 3210 may include a first gate stack GS1 and a second stack GS2 as described with reference to an embodiment of FIG. 9. The first and second gate stacks GS1 and GS2 may include a plurality of gate electrodes 130. Further, each of the plurality of semiconductor chips 2200 may include a plurality of contact plugs CNT electrically connected to the plurality of gate electrode 130, respectively.

Each of the plurality of semiconductor chips 2200 may include a penetration wire 3245 electrically connected to the plurality of peripheral wires 3110 of the first structure 3100 and extending into the second structure 3200. The penetration wire 3245 may be arranged outside of the gate stack 3210. However, embodiments of the present inventive concept are not necessarily limited thereto. For example, in some embodiments, the semiconductor package 3003 may further include a penetration wire penetrating the gate stack 3210. Each of the plurality of semiconductor chips 2200 may further include an input/output pad 2201 (see FIG. 13) electrically connected to the plurality of peripheral wires 3110 of the first structure 3100.

With reference to FIG. 15, a semiconductor package 4003 according to an embodiment may have a configuration similar to that of the semiconductor package 3003 of an embodiment described above with reference to FIG. 14. However, the semiconductor package 4003 may include a plurality of semiconductor chips 2200a.

Each of the plurality of semiconductor chips 2200a may include a semiconductor substrate 4010, a first structure 4100 on the semiconductor substrate 4010, and a second structure 4200 bonded to the first structure 4100 on the first structure 4100 through the wafer bonding method.

In an embodiment, the first structure 4100 may include a peripheral wire 4110 and a peripheral circuit region including a plurality of first junction structures 4150. The first structure 4100 may include the peripheral circuit transistor 60TR as described with reference to and embodiment of FIG. 8. Although the first structure 4100 is described in the drawings as having the same structure as the peripheral circuit region of the integrated circuit device 200 of FIG. 8, embodiments of the present inventive concept are not necessarily limited thereto.

The second structure 4200 may include a common source line 4205, a gate stack 4210 between the common source line 4205 and the first structure 4100, and a channel structure 4220 penetrating die gate stack 4210. The gate stack 4210 may include a first gate stack GS1 and a second stack GS2 as described with reference to FIG. 9. The first and second gate stacks GS1 and GS2 may include a plurality of gate electrodes 130. Further, each of the plurality of semiconductor chips 2200a may include a plurality of contact plugs CNT electrically connected to the gate electrode 130.

Also, each of the plurality of semiconductor chips 2200a may include a plurality of second junction structures 4250 electrically connected to each of the plurality of gate electrodes 130 of the gate stack 4210. For example, some of the plurality of second junction structures 4250 may be connected to a bit line 4240 electrically connected to the channel structure 4220. Others of the plurality of second junction structures 4250 may be electrically connected to the gate electrode 130 through the plurality of contact plugs CNT.

The plurality of first junction structures 4150 of the first structure 4100 and the plurality of second junction structures 4250 of the second structure 4200 may be in direct contact with each other and joined. In an embodiment, the joined portions of the plurality of first junction structures 4150 and the plurality of second junction structures 4250 may include a metal, for example, copper (Cu). However, embodiments of the present inventive concept are not necessarily limited thereto.

While the present inventive concept has been particularly shown and described with reference to non-limiting embodiments thereof, it will be understood that various changes in form and details may be made therein without departing from the spirit and scope of the present inventive concept.

What is claimed is:

1. A method of fabricating an integrated circuit device, the method comprising:
   forming on a semiconductor substrate a mold stack that includes a plurality of insulating layers and a plurality of mold layers alternately arranged;
   forming on the mold stack a mask pattern including an opening;
   forming a channel hole by removing the mold stack exposed through the opening;
   forming a sacrificial film on a lateral wall of the mold stack exposed through the channel hole;
   performing an oxidation process on the sacrificial film and the mold stack to convert the sacrificial film to a sacrificial oxide film;
   performing an etching process to remove the sacrificial oxide film;
   after the performing of the etching process, forming a channel structure filling the channel hole;
   forming a word line cut opening by removing a portion of the mold stack to expose an upper surface of the semiconductor substrate; and
   substituting the plurality of mold layers with a plurality of gate electrodes through the word line cut opening.

2. The method of claim 1, wherein:
   prior to the forming of the sacrificial film, the channel hole has a tapered shape, wherein a horizontal width of the channel hole increases along a direction perpendicular to the upper surface of the semiconductor substrate; and
   after the performing of the etching process, the channel hole has a rectangular shape in which the horizontal width of the channel hole is constant along the direction perpendicular to the upper surface of the semiconductor substrate.

3. The method of claim 1, wherein:
   a horizontal width of the sacrificial film at an upper portion of the mold stack is greater than a horizontal width of the sacrificial film at a lower portion of the mold stack; and
   a horizontal width of the sacrificial oxide film at the upper portion of the mold stack is substantially identical to a horizontal width of the sacrificial oxide film at the lower portion of the mold stack.

4. The method of claim 3, wherein a size of an oxidized portion of the mold layer at the upper portion of the mold stack is less than a size of an oxidized portion of the mold layer at the lower portion of the mold stack.

5. The method of claim 1, further comprising:
   forming a round recess at an end of each of the plurality of mold layers in contact with the channel hole,
   wherein an area of the round recess at an upper portion of the mold stack is less than an area of the round recess at a lower portion of the mold stack.

6. The method of claim 1, wherein:
   the word line cut opening has a tapered shape wherein a horizontal width of the word line cut opening increases along a direction perpendicular to the upper surface of the semiconductor substrate; and
   the channel structure has a rectangular shape, wherein a horizontal width of the channel structure is constant along the direction perpendicular to the upper surface of the semiconductor substrate.

7. The method of claim 1, wherein the oxidation process includes a radical oxidation process using remote plasma.

8. The method of claim 1, wherein the etching process includes a wet etching process including hydrofluoric acid.

9. The method of claim 8, wherein:
   the sacrificial film is entirely converted into the sacrificial oxide film; and
   the sacrificial film is entirely removed by the etching process.

10. A method of fabricating an integrated circuit device, the method comprising:
    forming on a semiconductor substrate a first mold stack that includes a plurality of insulating layers and a plurality of mold layers alternately arranged;
    forming on the first mold stack a first mask pattern including a first opening;
    forming a first channel hole by removing the first mold stack exposed through the first opening;
    forming a second mold stack on the first mold stack, the second mold stack including a plurality of insulating layers and a plurality of mold layers alternately arranged;
    forming on the second mold stack a second mask pattern including a second opening;
    forming a second channel hole by removing the second mold stack exposed through the second opening;

forming a sacrificial film on a lateral wall of the first and second mold stacks exposed through the first channel hole and the second channel hole, respectively;

performing an oxidation process on the sacrificial film, the first mold stack and the second mold stack to convert the sacrificial film to a sacrificial oxide film; and performing an etching process to remove the sacrificial oxide film.

11. The method of claim 10, wherein:

prior to the forming of the sacrificial film, a lateral wall of each of the first and second channel holes has a tapered shape along a vertical direction perpendicular to an upper surface of the semiconductor substrate; and after the performing of the etching process, the lateral wall of each of the first and second channel holes is substantially perpendicular to the upper surface of the semiconductor substrate along the vertical direction.

12. The method of claim 10, further comprising:

after the performing of the etching process, forming a channel structure filling the first and second channel holes;

forming on the second mold stack a third mask pattern including a third opening;

forming a word line cut opening by removing the first and second mold stacks exposed through the third opening; and removing the plurality of mold layers through the word line cut opening.

13. The method of claim 12, wherein:

the word line cut opening has a tapered shape wherein a horizontal width of the word line cut opening increases along a direction perpendicular to an upper surface of the semiconductor substrate; and the channel structure has a rectangular shape wherein a horizontal width of the channel structure is constant along the direction perpendicular to the upper surface of the semiconductor substrate.

14. The method of claim 12, wherein the channel structure includes a plurality of round protrusions protruding outwards from a lateral wall of the channel structure.

15. The method of claim 14, wherein an area of the plurality of round protrusions varies along a direction perpendicular to an upper surface of the semiconductor substrate.

16. The method of claim 14, further comprising:

after the removing of the plurality of mold layers, forming a plurality of gate electrodes in an area formerly occupied by the plurality of mold layers, wherein a plurality of round recesses respectively corresponding to the plurality of round protrusions are formed at an end of the plurality of gate electrodes.

17. The method of claim 12, further comprising forming a base layer between the semiconductor substrate and the first mold stack, wherein the base layer directly contacts a channel layer in the channel structure.

18. A method of fabricating an electronic system, the method comprising:

preparing a main substrate;

arranging an integrated circuit device on the main substrate; and arranging a controller electrically connected to the integrated circuit device on the main substrate, wherein a method of fabricating the integrated circuit device comprises:

forming on a semiconductor substrate a mold stack that includes a plurality of insulating layers and a plurality of mold layers alternately arranged;

forming on the mold stack a mask pattern including an opening;

forming a channel hole by removing the mold stack exposed through the opening;

forming a sacrificial film on a lateral wall of the mold stack exposed through the channel hole;

performing an oxidation process on the sacrificial film and the mold stack to convert the sacrificial film to a sacrificial oxide film;

performing an etching process to remove the sacrificial oxide film; and substituting the plurality of mold layers with a plurality gate electrodes.

19. The method of claim 18, wherein:

the preparing of the main substrate includes forming wire patterns configured to electrically connect the integrated circuit device and the controller; and forming a round recess at an end of the plurality of gate electrodes electrically connected to the wire patterns in the integrated circuit device.

\* \* \* \* \*